(12) United States Patent
Zhao et al.

(10) Patent No.: US 9,136,254 B2
(45) Date of Patent: Sep. 15, 2015

(54) MICROELECTRONIC PACKAGE HAVING WIRE BOND VIAS AND STIFFENING LAYER

(71) Applicant: Invensas Corporation, San Jose, CA (US)

(72) Inventors: Zhijun Zhao, San Jose, CA (US); Roseann Alatorre, San Martin, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/757,677

(22) Filed: Feb. 1, 2013

(65) Prior Publication Data

US 2014/0217619 A1    Aug. 7, 2014

(51) Int. Cl.
| | |
|---|---|
| H01L 23/48 | (2006.01) |
| H01L 23/52 | (2006.01) |
| H01L 29/40 | (2006.01) |
| H01L 23/04 | (2006.01) |
| H01L 25/10 | (2006.01) |
| H01L 23/31 | (2006.01) |
| H01L 23/498 | (2006.01) |
| H01L 21/56 | (2006.01) |

(Continued)

(52) U.S. Cl.
CPC .......... *H01L 25/105* (2013.01); *H01L 23/3128* (2013.01); *H01L 23/3135* (2013.01); *H01L 23/49811* (2013.01); *H01L 21/565* (2013.01); *H01L 23/5389* (2013.01); *H01L 24/16* (2013.01); *H01L 24/48* (2013.01); *H01L 2224/16145* (2013.01); *H01L 2224/16227* (2013.01); *H01L 2224/45144* (2013.01); *H01L 2224/48091* (2013.01); *H01L 2224/48145* (2013.01); *H01L 2224/48227* (2013.01); *H01L 2224/49171* (2013.01); *H01L 2224/78301* (2013.01); *H01L 2225/1023* (2013.01); *H01L 2225/1058* (2013.01); *H01L 2924/19107* (2013.01)

(58) Field of Classification Search
USPC ......... 257/784, 786, 787, 773, 774, 782, 730, 257/621, 692, 696, E21.597, E21.506, 257/E23.024
See application file for complete search history.

(56) References Cited

U.S. PATENT DOCUMENTS

| | | | |
|---|---|---|---|
| 6,476,503 B1 | 11/2002 | Imamura et al. | |
| 6,765,287 B1 | 7/2004 | Lin | |
| 7,051,915 B2 * | 5/2006 | Mutaguchi | ............ 228/4.5 |

(Continued)

FOREIGN PATENT DOCUMENTS

| | | |
|---|---|---|
| JP | 2008251794 A | 10/2008 |
| WO | 2009096950 A1 | 8/2009 |
| WO | 2013059181 A1 | 4/2013 |

OTHER PUBLICATIONS

International Search Report and Written Opinion for Application No. PCT/US2014/014181 dated Jun. 13, 2014.

(Continued)

*Primary Examiner* — A. Sefer
*Assistant Examiner* — Dilinh Nguyen
(74) *Attorney, Agent, or Firm* — Lerner, David, Littenberg, Krumholz & Mentlik, LLP

(57) ABSTRACT

Microelectronic components and methods forming such microelectronic components are disclosed herein. The microelectronic components may include a plurality of electrically conductive vias in the form of wire bonds extending from a bonding surface of a substrate, such as surfaces of electrically conductive elements at a surface of the substrate.

10 Claims, 37 Drawing Sheets

(51) Int. Cl.
    *H01L 23/538*    (2006.01)
    *H01L 23/00*     (2006.01)

(56) References Cited

U.S. PATENT DOCUMENTS

| | | | |
|---|---|---|---|
| 7,176,506 B2 | 2/2007 | Beroz et al. | |
| 2001/0042925 A1 | 11/2001 | Yamamoto et al. | |
| 2006/0228825 A1 | 10/2006 | Hembree | |
| 2007/0126091 A1 | 6/2007 | Wood et al. | |
| 2007/0246819 A1 | 10/2007 | Hembree et al. | |
| 2009/0026609 A1 | 1/2009 | Masuda | |
| 2009/0085205 A1* | 4/2009 | Sugizaki | 257/737 |
| 2009/0236700 A1 | 9/2009 | Moriya | |
| 2010/0007026 A1* | 1/2010 | Shikano | 257/773 |
| 2010/0232129 A1 | 9/2010 | Haba et al. | |
| 2012/0086111 A1* | 4/2012 | Iwamoto et al. | 257/666 |

OTHER PUBLICATIONS

Partial International Search Report for Application No. PCT/US2014/014181 dated May 8, 2014.

* cited by examiner

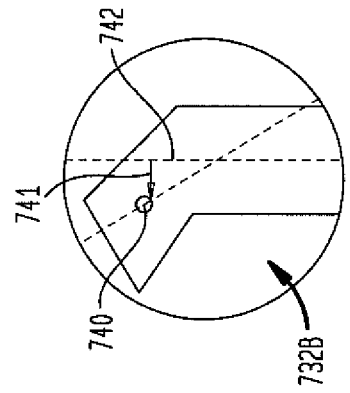
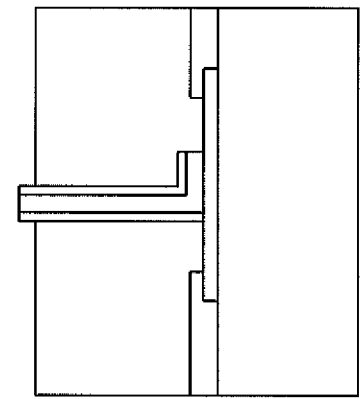
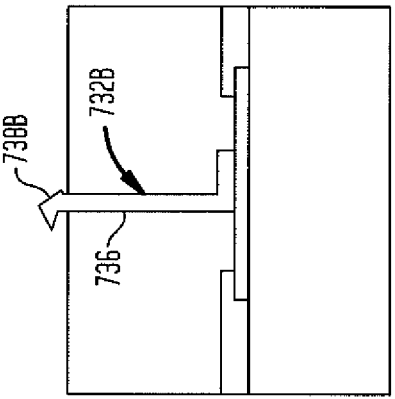
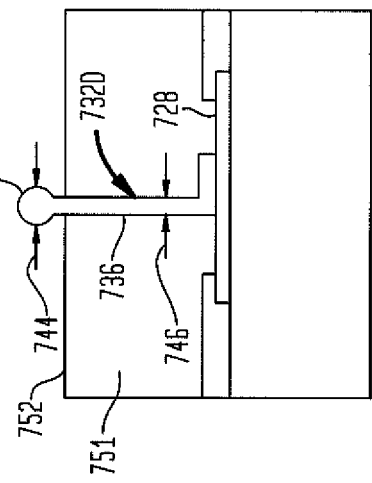
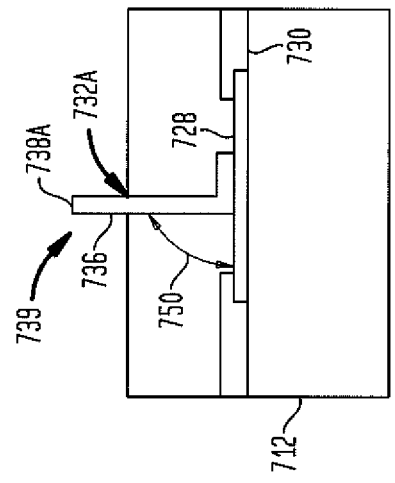

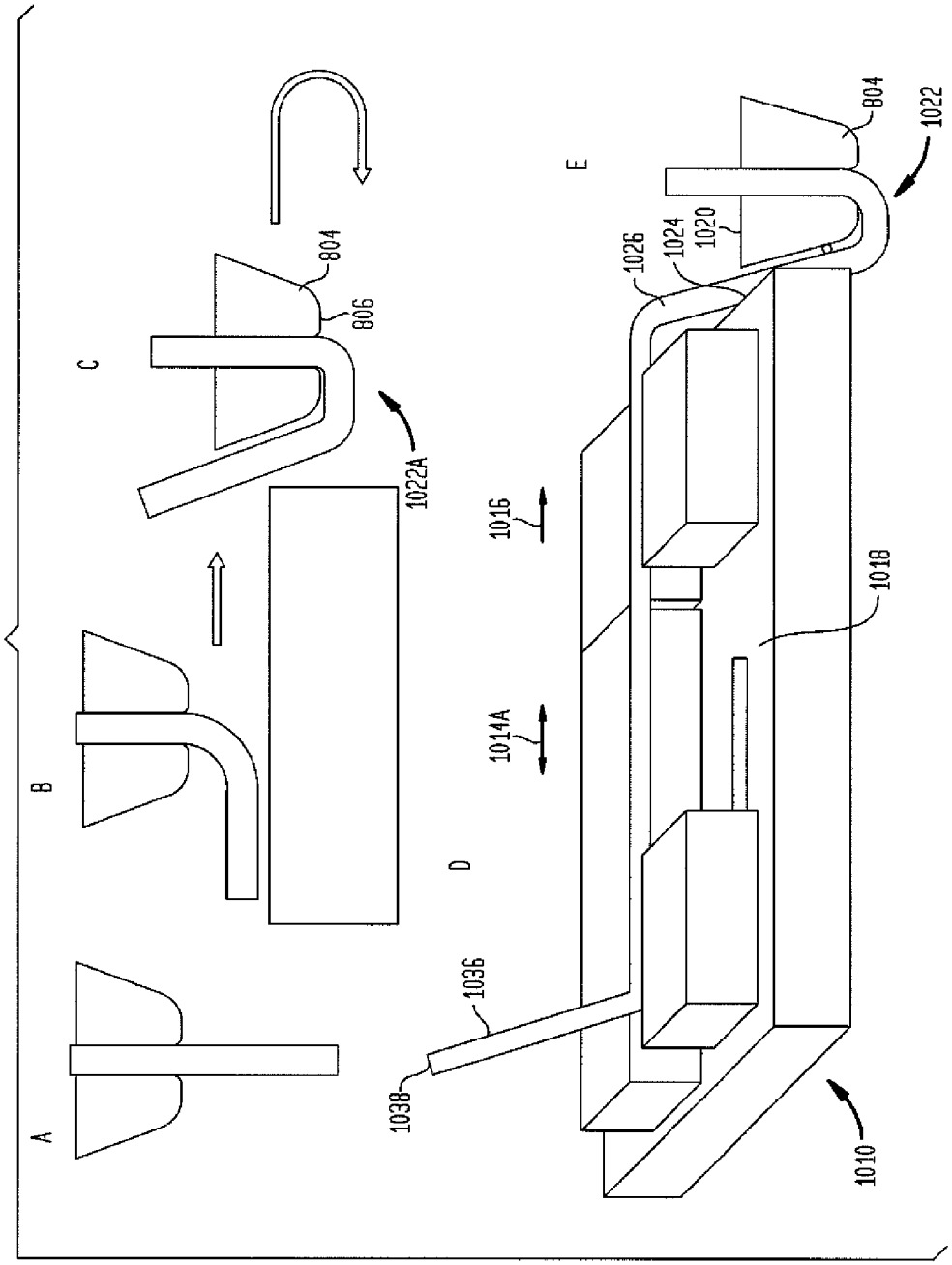

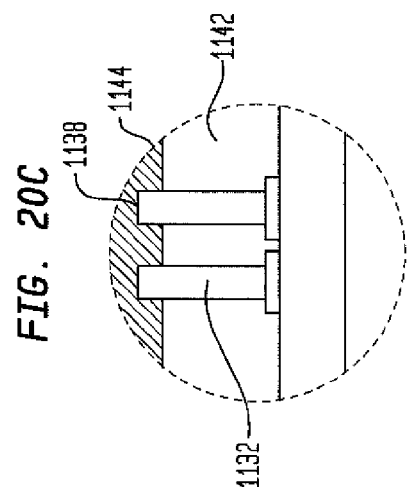
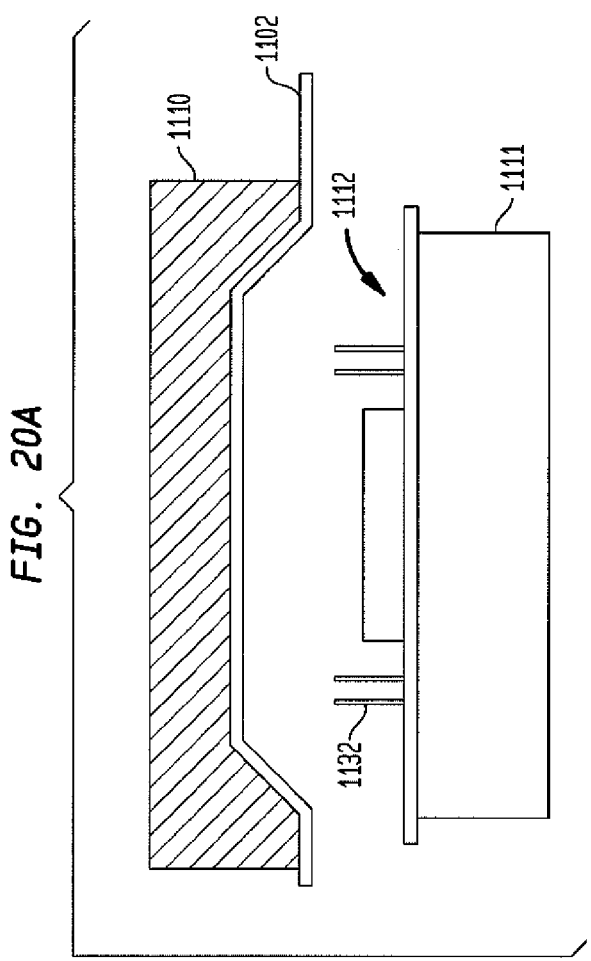
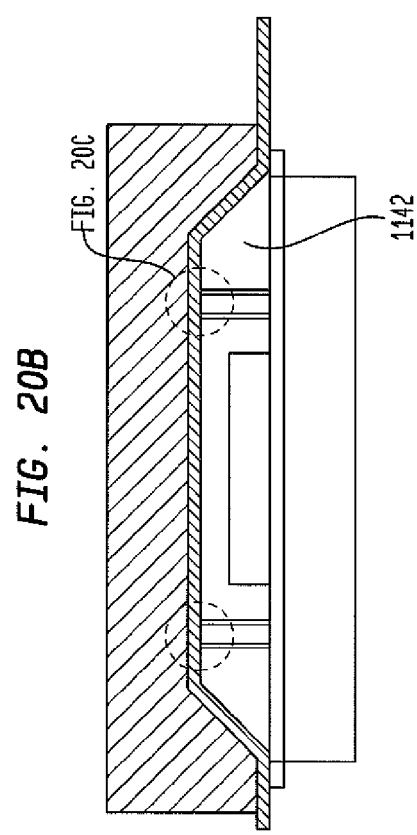

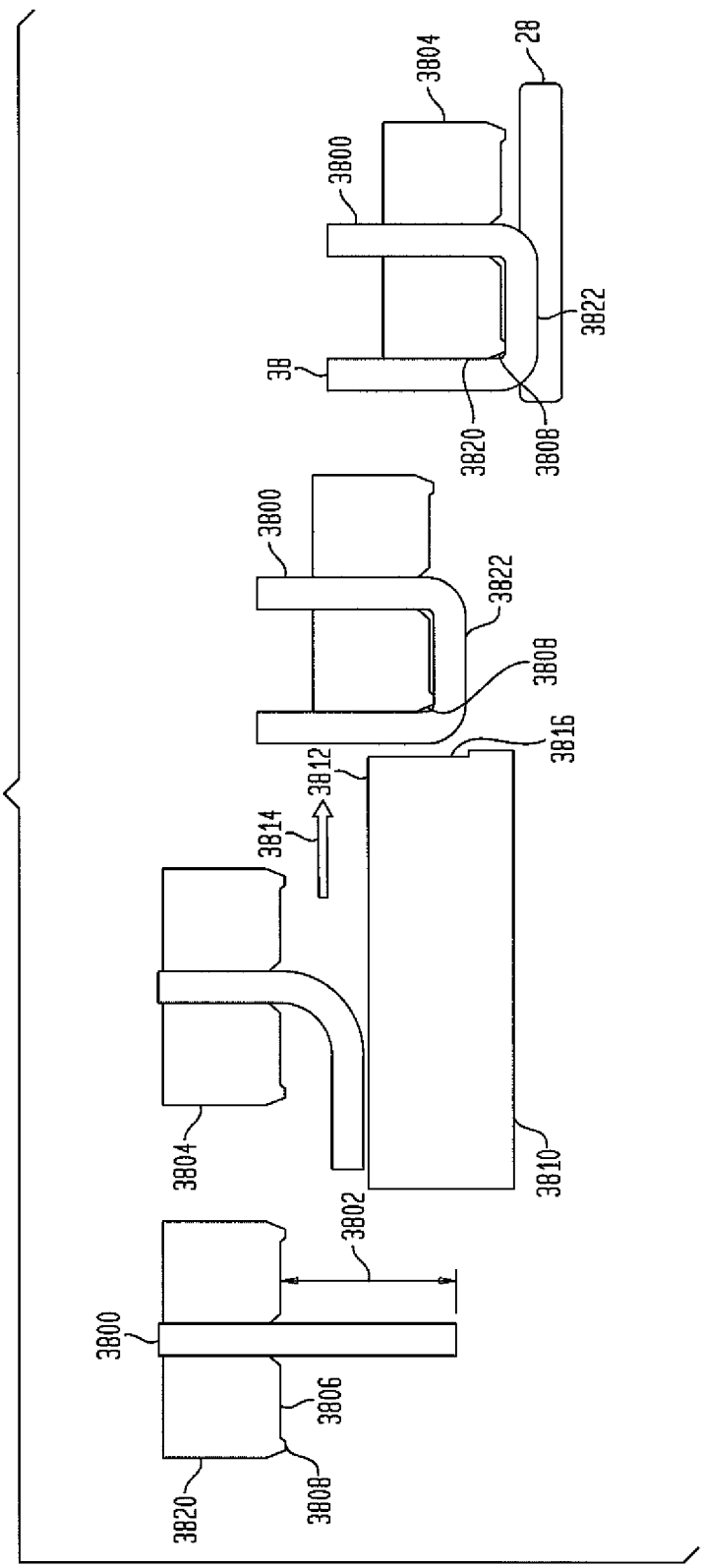

MICROELECTRONIC PACKAGE HAVING WIRE BOND VIAS AND STIFFENING LAYER

CROSS-REFERENCE TO RELATED APPLICATIONS

The present application incorporates by reference herein the commonly owned application of Damberg et al., entitled "Method of Making Wire Bond Vias and Microelectronic Package Having Wire Bond Vias" filed on even date herewith.

BACKGROUND OF THE INVENTION

The subject matter of the present application relates to the packaging of a microelectronic element and related circuitry, for example, a method of making a structure, e.g., microelectronic package having a plurality of electrically conductive vias in form of wire bonds extending from bonding surfaces of the substrate, such as surfaces of electrically conductive elements at a surface of a substrate.

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnect distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Solder balls or the like have been used to bridge the gap between the contacts on the top of a lower substrate to the contacts on the bottom of the next higher substrate. The solder balls must be higher than the height of the chip in order to connect the contacts. Examples of stacked chip arrangements and interconnect structures are provided in U.S. Patent App. Pub. No. 2010/0232129 ("the '129 Publication"), the disclosure of which is incorporated by reference herein in its entirety.

Microcontact elements in the form of elongated posts or pins may be used to connect microelectronic packages to circuit boards and for other connections in microelectronic packaging. In some instances, microcontacts have been formed by etching a metallic structure including one or more metallic layers to form the microcontacts. The etching process limits the size of the microcontacts. Conventional etching processes typically cannot form microcontacts with a large ratio of height to maximum width, referred to herein as "aspect ratio". It has been difficult or impossible to form arrays of microcontacts with appreciable height and very small pitch or spacing between adjacent microcontacts. Moreover, the configurations of the microcontacts formed by conventional etching processes are limited.

Despite all of the above-described advances in the art, still further improvements in making and testing microelectronic packages would be desirable.

BRIEF SUMMARY OF THE INVENTION

Disclosed herein are microelectronic elements and a method of manufacturing microelectronic elements.

In an embodiment, a microelectronic package may include a component, such as a substrate, having a surface and a plurality of conductive elements at the surface, and a plurality of wire bonds having first ends joined to the conductive elements and second ends remote from the first ends in which the wire bonds have lengths between their respective first and second ends.

Each wire bond may be stitch bonded to one of the conductive elements. The wire bonds may have bonding tool marks thereon adjacent the second ends of the wire bonds. The wire bonds may be tapered in at least one direction adjacent the second ends of the wire bonds.

A stiffening layer may overly the surface and may cover a first portion of the length of each wire bond. The stiffening layer may cover at least 10 percent and/or 50 micrometers of the length of the wire bonds. The second ends of the wires may project away from the encapsulation layer at an angle of 65 to 90 degrees with respect to a plane defined by the surface of the encapsulation layer.

An encapsulation layer may overly the stiffening layer above the surface of the component and may cover a second portion of the length of each wire bond. Second ends of the wire bonds may be at least partially uncovered by the encapsulation layer at a surface of the encapsulation layer above the stiffening layer and remote from the stiffening layer. The microelectronic package may further include a raised material region at least partially bordering the stiffening layer in at least one direction parallel to the surface of the component.

In an embodiment, a method of forming a component may include forming a plurality of wire bonds. Each wire bond may have a first end bonded to a conductive element of a plurality of conductive elements at a surface of a component. The wire bonds may have second ends remote from the first ends, and may have lengths between their respective first and second ends. The method may further include forming a first layer overlying the surface of the component and covering a first portion of the length of each bond. Prior to the forming of the first layer, a raised region may be provided such that the raised region at least partially contains a material of the first layer in at least one direction parallel to the surface of the component. A second layer may be formed overlying the first layer above the surface of the component and covering a second portion of the length of each wire bond. Prior to depositing a material of the second layer in the forming of the second layer, the wire bonds may be inserted into a removable film, which may then be removed. The removable film may inhibit the second material from covering the second ends of the wire bonds.

The forming of the first layer may include curing the first layer, and the forming of the second layer may occur after the forming of the first layer. The first layer may inhibit movement of the second ends of the wire bonds during the forming of the second layer. The first and second layers may have different material properties. The first layer may be a stiffening layer and/or the second layer may be an encapsulation. Second ends of the wire bonds may be uncovered by the second layer at a surface of the second layer above the first layer and remote from the first layer.

These and other embodiments of the present disclosure are more fully described hereinbelow.

BRIEF DESCRIPTION OF THE DRAWINGS

FIG. 13A is a fragmentary sectional view illustrating a wire bond via in a microelectronic package according to an embodiment of the invention;

FIG. 13B is a fragmentary sectional view illustrating a wire bond via in a microelectronic package according to an embodiment of the invention;

FIG. 13C is an enlarged fragmentary sectional view illustrating a wire bond via in a microelectronic package according to the embodiment shown in FIG. 13B;

FIG. 13D is a fragmentary sectional view illustrating a wire bond via in a microelectronic package according to an embodiment of the invention;

FIG. 13E is an enlarged fragmentary sectional view illustrating a wire bond via in a microelectronic package according to the embodiment shown in FIG. 13D;

FIG. 13F is a fragmentary sectional view illustrating a wire bond via in a microelectronic package according to an embodiment of the invention;

FIG. 19 illustrates stages in a method of forming a metal wire segment prior to bonding the wire segment to a conductive element according to an embodiment of the invention;

FIGS. 20A and 20B are sectional views illustrating one stage and another stage subsequent thereto in a method of forming an encapsulation layer of a microelectronic package according to an embodiment of the invention;

FIG. 20C is an enlarged sectional view further illustrating the stage corresponding to FIG. 19;

FIG. 36 shows a portion of a machine that can be used in forming various wire bond vias according in a method according to another embodiment of the present disclosure;

DETAILED DESCRIPTION

Figure 1:
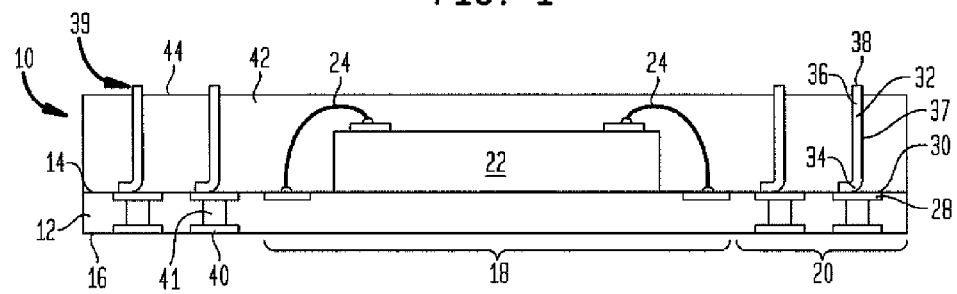
FIG. 1 is sectional view depicting a microelectronic package according to an embodiment of the invention.

Turning now to the figures, where similar numeric references are used to indicate similar features, there is shown in FIG. 1 a microelectronic assembly 10 according to an embodiment of the present invention. The embodiment of FIG. 1 is a microelectronic assembly in the form of a packaged microelectronic element such as a semiconductor chip assembly that is used in computer or other electronic applications.

The microelectronic assembly 10 of FIG. 1 includes a substrate 12 having a first surface 14 and a second surface 16. The substrate 12 typically is in the form of a dielectric element, which is substantially flat. The dielectric element may be sheet-like and may be thin. In particular embodiments, the dielectric element can include one or more layers of organic dielectric material or composite dielectric materials, such as, without limitation: polyimide, polytetrafluoroethylene ("PTFE"), epoxy, epoxy-glass, FR-4, BT resin, thermoplastic, or thermoset plastic materials. The substrate may be a substrate of a package having terminals for further electrical interconnection with a circuit panel, e.g., a circuit board. Alternatively, the substrate can be a circuit panel or circuit board. In one example thereof, the substrate can be a module board of a dual-inline memory module ("DIMM"). In yet another variation, the substrate can be a microelectronic element such as may be or include a semiconductor chip embodying a plurality of active devices, e.g., in form of an integrated circuit or otherwise.

The first surface 14 and second surface 16 are preferably substantially parallel to each other and are spaced apart at a distance perpendicular to the surfaces 14,16 defining the thickness of the substrate 12. The thickness of substrate 12 is preferably within a range of generally acceptable thicknesses for the present application. In an embodiment, the distance between the first surface 14 and the second surface 16 is between about 25 and 500 µm. For purposes of this discussion, the first surface 14 may be described as being positioned opposite or remote from second surface 16. Such a description, as well as any other description of the relative position of elements used herein that refers to a vertical or horizontal position of such elements is made for illustrative purposes only to correspond with the position of the elements within the Figures, and is not limiting.

In a preferred embodiment, substrate 12 is considered as divided into a first region 18 and a second region 20. The first region 18 lies within the second region and includes a central portion of the substrate 12 and extends outwardly therefrom. The second region 20 substantially surrounds the first region 18 and extends outwardly therefrom to the outer edges of the substrate 12. In this embodiment, no specific characteristic of the substrate itself physically divides the two regions; however, the regions are demarked for purposes of discussion herein with respect to treatments or features applied thereto or contained therein.

A microelectronic element 22 can be mounted to first surface 14 of substrate 12 within first region 18. Microelectronic element 22 can be a semiconductor chip or another comparable device. In the embodiment of FIG. 1, microelectronic element 22 is mounted to first surface 14 in what is known as a conventional or "face-up" fashion. In such an embodiment, wire leads 24 can be used to electrically connect microelectronic element 22 to some of a plurality of conductive elements 28 exposed at first surface 14. Wire leads 24 can also be joined to traces (not shown) or other conductive features within substrate 12 that are, in turn, connected to conductive elements 28.

Conductive elements 28 include respective "contacts" or pads 30 that are exposed at the first surface 14 of substrate 12. As used in the present description, when an electrically conductive element is described as being "exposed at" the surface of another element having dielectric structure, it indicates that the electrically conductive structure is available for contact with a theoretical point moving in a direction perpendicular to the surface of the dielectric structure toward the surface of the dielectric structure from outside the dielectric structure. Thus, a terminal or other conductive structure that is exposed at a surface of a dielectric structure may project from such surface; may be flush with such surface; or may be recessed relative to such surface and exposed through a hole or depression in the dielectric. The conductive elements 28 can be flat, thin elements in which pad 30 is exposed at first surface 14 of substrate 12. In one embodiment, conductive elements 28 can be substantially circular and can be interconnected between each other or to microelectronic element 22 by traces (not shown). Conductive elements 28 can be formed at least within second region 20 of substrate 12. Additionally, in certain embodiments, conductive elements 28 can also be formed within first region 18. Such an arrangement is particularly useful when mounting microelectronic element 122 (FIG. 3) to substrate 112 in what is known as a "flip-chip" configuration, where contacts on the microelectronic element 122 can be connected to conductive elements 128 within first region 118 by solder bumps 126 or the like that are positioned beneath microelectronic element 122. In an embodiment, conductive elements 28 are formed from a solid metal material such as copper, gold, nickel, or other materials that are acceptable for such an application, including various alloys including one or more of copper, gold, nickel or combinations thereof.

At least some of conductive elements 28 can be interconnected to corresponding second conductive elements 40, such as conductive pads, exposed at second surface 16 of substrate 12. Such an interconnection can be completed using vias 41 formed in substrate 12 that can be lined or filled with conductive metal that can be of the same material as conductive elements 28 and 40. Optionally, conductive elements 40 can be further interconnected by traces on substrate 12.

Microelectronic assembly 10 further includes a plurality of wire bonds 32 joined to at least some of the conductive elements 28, such as on the pads 30 thereof. In some examples, wire bonds 32 may be formed of wire, e.g., of copper or copper alloy, gold, aluminum, or a combination of a base wire metal, e.g., copper, copper alloy, gold or aluminum with a metallic coating finish or layer thereon of a different metal, which in some cases may be gold or palladium. In some cases, the wire may have a diameter ranging from 10 micrometers and up, in more specific examples, can be 17 micrometers, 25 micrometers or greater, e.g., 35 micrometers or 50 micrometers. Where the microelectronic assembly 10 requires a large number of interconnects, or input or output connections, to the microelectronic assembly, there may be 1000-2000 wire bonds 32 as an example.

Wire bonds 32 are bonded along a portion of the edge surface 37 thereof to the conductive elements 28. Examples of such bonding include stitch bonding, wedge bonding and the like. As will be described in further detail below, a wire bonding tool can be used to stitch-bond a segment of wire extending from a capillary of the wire bonding tool to a conductive element 28 while severing the stitch-bonded end of the wire from a supply of wire in the capillary. The wire bonding tool may leave a mark (not shown) near the tip of the wire bonds 32 resulting from a process of forming the wire bond. The mark may result in a tapered region of the wire bond and/or have any geometric shape including a ball-shape.

The wire bonds are stitch-bonded to the conductive elements 28 at their respective "bases" 34. Hereinafter, the "base" 34 of such stitch-bonded wire bond 32 refers to the portion of the wire bond which forms a joint with the conductive element 28. Alternatively, wire bonds can be joined to at least some of the conductive elements using ball bonds, examples of which are shown and described in co-pending, commonly assigned U.S. Patent Application, the entire disclosure of which is incorporated by reference herein.

The incorporation of various forms of edge bonds, as described herein, can allow for conductive elements 28 to be non-solder-mask-defined ("NSMD") type conductive elements. In packages using other types of connections to conductive elements, for example solder balls or the like, the conductive elements are solder-mask defined. That is the conductive elements are exposed in openings formed in a solder mask material layer. In such an arrangement, the solder mask layer can partially overlie the conductive elements or can contact the conductive elements along an edge thereof. By contrast, a NSMD conductive element is one that is not contacted by a solder mask layer. For example, the conductive element can be exposed on a surface of a substrate that does not have a solder mask layer or, if present, a solder mask layer on the surface can have an opening with edges spaced away from the conductive element. Such NSMD conductive elements can also be formed in shapes that are not round. Solder-mask defined pads can often be round when intended to be used to bond to an element via a solder mass, which forms a generally round profile on such a surface. When using, for example, an edge bond to attach to a conductive element, the bond profile itself is not round, which can allow for a non-round conductive element. Such non-round conductive elements can be, for example oval, rectangular, or of a rectangular shape with rounded corners. They can further be configured to be longer in the direction of the edge bond to accommodate the bond, while being shorter in the direction of the wire bond's 32 width. This can allow for a finer pitch at the substrate 12 level. In one example, the conductive elements 28 can be between about 10% and 25% larger than the intended size of base 34 in both directions. This can allow for variations in the precision with which the bases 34 are located and for variations in the bonding process.

Figure 23A:
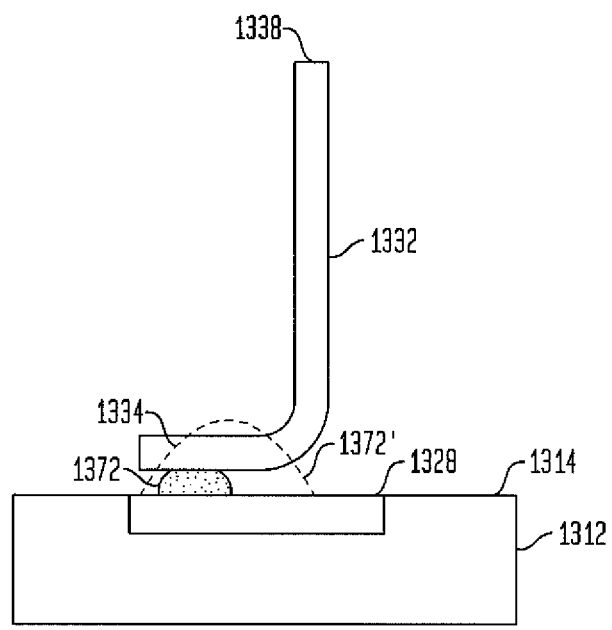
FIGS. 23A and 23B are fragmentary sectional views illustrating wire bonds according to another embodiment.
Figure 23B:
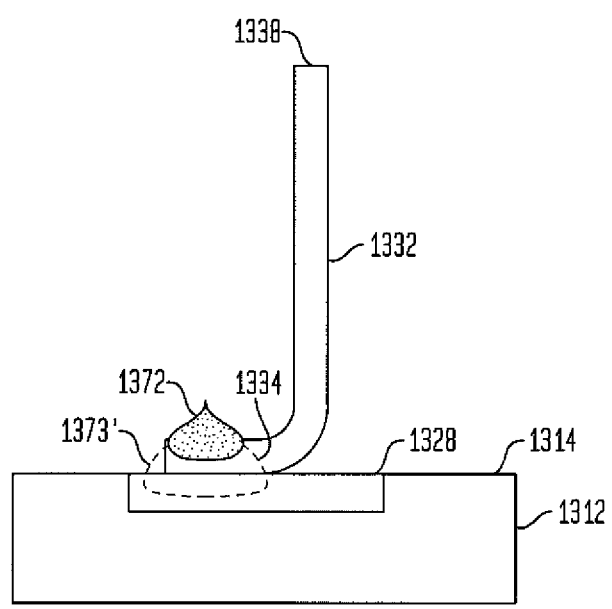

In some embodiments, an edge bonded wire bond, as described above, which can be in the form of a stitch bond, can be combined with a ball bond. As shown in FIG. 23A a ball bond 1333 can be formed on a conductive element 1328 and a wire bond 1332 can be formed with a base 1338 stitch bonded along a portion of the edge surface 1337 to ball bond 1372. In another example, the general size and placement of the ball bond can be as shown at 1372'. In another variation shown in FIG. 23B, a wire bond 1332 can be edge bonded along conductive element 1328, such as by stitch bonding, as described above. A ball bond 1373 can then be formed on top of the base 1338 of wire bond 1334. In one example, the size and placement of the ball bond can be as shown at 1373'. Each of the wire bonds 32 can extend to a free end 36 remote from the base 34 of such wire bond and remote from substrate 12. The ends 36 of wire bonds 32 are characterized as being free in that they are not electrically connected or otherwise joined to microelectronic element 22 or any other conductive features within microelectronic assembly 10 that are, in turn, connected to microelectronic element 22. In other words, free ends 36 are available for electronic connection, either directly or indirectly as through a solder ball or other features discussed herein, to a conductive feature external to assembly 10. The fact that ends 36 are held in a predetermined position by, for example, encapsulation layer 42 or otherwise joined or electrically connected to another conductive feature does not mean that they are not "free" as described herein, so long as any such feature is not electrically connected to microelectronic element 22. Conversely, base 34 is not free as it is either directly or indirectly electrically connected to microelectronic element 22, as described herein. As shown in FIG. 1, the bases 34 of the wire bonds 32 typically are curved at their stitch-bond (or other edge-bonded) joints with the respective conductive elements 28. Each wire bond has an edge surface 37 extending between the base 34 thereof and the end 36 of such wire bond. The particular size and shape of base 34 can vary according to the type of material used to form wire bond 32, the desired strength of the connection between wire bond 32 and conductive element 28, or the particular process used to form wire bond 32. Alternative embodiments are possible where wire bonds 32 are additionally or alternatively joined to conductive elements 40 exposed on second surface 16 of substrate 12, extending away therefrom.

Figure 2:
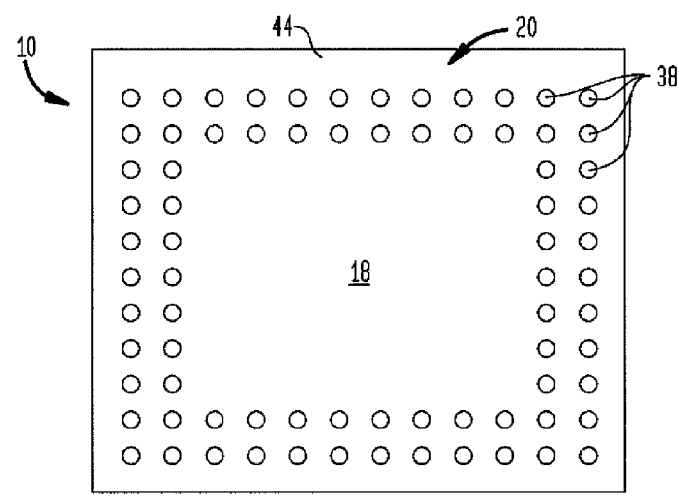
FIG. 2 shows a top plan view of the microelectronic package of FIG. 1.

In a particular example, a first one of the wire bonds 32 may be adapted, i.e., constructed, arranged, or electrically coupled to other circuitry on the substrate for carrying a first signal electric potential, and a second one of the wire bonds 32 may be so adapted for simultaneously carrying a second signal electric potential different from the first signal electric potential. Thus, when a microelectronic package as seen in FIGS. 1 and 2 is energized, the first and second wire bonds can simultaneously carry first and second different signal electric potentials.

Wire bond 32 can be made from a conductive material such as copper, copper alloy or gold. Additionally, wire bonds 32 can be made from combinations of materials, such as from a core of a conductive material, such as copper or aluminum, for example, with a coating applied over the core. The coating can be of a second conductive material, such as aluminum, nickel or the like. Alternatively, the coating can be of an insulating material, such as an insulating jacket.

In particular embodiments, the wire bonds may have a core of primary metal and a metallic finish including a second metal different from the primary metal overlying the primary metal. For example, the wire bonds may have a primary metal core of copper, copper alloy, aluminum or gold and the metallic finish can include palladium. Palladium can avoid oxidation of a core metal such as copper, and may serve as a diffusion barrier to avoid diffusion a solder-soluble metal such as gold in solder joints between unencapsulated portions of the wire bonds and another component as will be described further below. Thus, in one embodiment, the wire bonds can be formed of palladium-coated copper wire or palladium-coated gold wire which can be fed through the capillary of the wire bonding tool.

Figure 6:
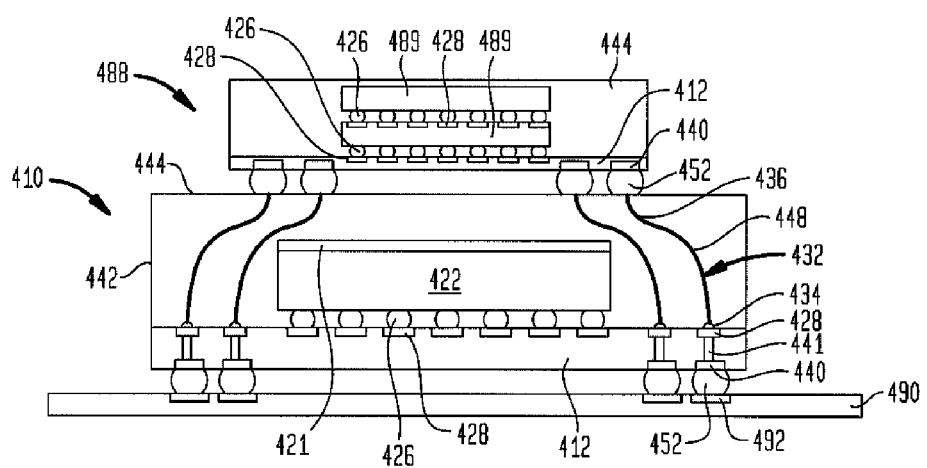
FIG. 6 is a sectional view illustrating a microelectronic assembly including a microelectronic package according to one or more of the foregoing embodiments and an additional microelectronic package and a circuit panel electrically connected thereto.

In an embodiment, the wire used to form wire bonds 32 can have a thickness, i.e., in a dimension transverse to the wire's length, of between about 15 μm and 150 μm. In general, a wire bond is formed on a conductive element, such as conductive element 28, a pad, trace or the like, using specialized equipment that is known in the art. The free end 36 of wire bond 32 has an end surface 38. End surface 38 can form at least a part of a contact in an array formed by respective end surfaces 38 of a plurality of wire bonds 32. FIG. 2 shows an exemplary pattern for such an array of contacts formed by end surfaces 38. Such an array can be formed in an area array configuration, variations of which could be implemented using the structures described herein. Such an array can be used to electrically and mechanically connect the microelectronic assembly 10 to another microelectronic structure, such as to a printed circuit board ("PCB"), or to other packaged microelectronic elements, an example of which is shown in FIG. 6. In such a stacked arrangement, wire bonds 32 and conductive elements 28 and 40 can carry multiple electronic signals therethrough, each having a different signal potential to allow for different signals to be processed by different microelectronic elements in a single stack. Solder masses 52 can be used to interconnect the microelectronic assemblies in such a stack, such as by electronically and mechanically attaching end surfaces 38 to conductive elements 40.

Microelectronic assembly 10 further includes an encapsulation layer 42 formed from a dielectric material. In the embodiment of FIG. 1, encapsulation layer 42 is formed over the portions of first surface 14 of substrate 12 that are not otherwise covered by or occupied by microelectronic element 22, or conductive elements 28. Similarly, encapsulation layer 42 is formed over the portions of conductive elements 28, including pad 30 thereof, that are not otherwise covered by wire bonds 32. Encapsulation layer 42 can also substantially cover microelectronic element 22, wire bonds 32, including the bases 34 and at least a portion of edge surfaces 37 thereof. A portion of wire bonds 32 can remain uncovered by encapsulation layer 42, which can also be referred to as unencapsulated portions 39, thereby making the wire bond available for electrical connection to a feature or element located outside of encapsulation layer 42. In an embodiment, end surfaces 38 of wire bonds 32 remain uncovered by encapsulation layer 42 within major surface 44 of encapsulation layer 42. Other embodiments are possible in which a portion of edge surface 37 is uncovered by encapsulation layer 42 in addition to or as an alternative to having end surface 38 remain uncovered by encapsulation layer 42. In other words, encapsulation layer 42 can cover all of microelectronic assembly 10 from first surface 14 and above, with the exception of a portion of wire bonds 36, such as end surfaces 38, edge surfaces 37 or combinations of the two. In the embodiments shown in the Figures, a surface, such as major surface 44 of encapsulation layer 42 can be spaced apart from first surface 14 of substrate 12 at a distance great enough to cover microelectronic element 22. Accordingly, embodiments of microelectronic assembly 10 in which ends 38 of wire bonds 32 are flush with surface 44, will include wire bonds 32 that are taller than the microelectronic element 22, and any underlying solder bumps for flip chip connection. Other configurations for encapsulation layer 42, however, are possible. For example, the encapsulation layer can have multiple surfaces with varying heights. In such a configuration, the surface 44 within which ends 38 are positioned can be higher or lower than an upwardly facing surface under which microelectronic element 22 is located.

Encapsulation layer 42 serves to protect the other elements within microelectronic assembly 10, particularly wire bonds 32. This allows for a more robust structure that is less likely to be damaged by testing thereof or during transportation or assembly to other microelectronic structures. Encapsulation layer 42 can be formed from a dielectric material with insulating properties such as that described in U.S. Patent App. Pub. No. 2010/0232129, which is incorporated by reference herein.

Figure 3:
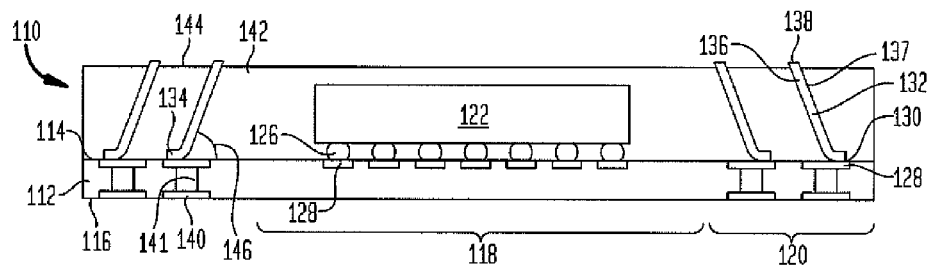
FIG. 3 is a sectional view depicting a microelectronic package according to a variation of the embodiment shown in FIG. 1.

FIG. 3 shows an embodiment of microelectronic assembly 110 having wire bonds 132 with ends 136 that are not positioned directly above the respective bases 34 thereof. That is, considering first surface 114 of substrate 112 as extending in two lateral directions, so as to substantially define a plane, end 136 or at least one of the wire bonds 132 is displaced in at least one of these lateral directions from a corresponding lateral position of base 134. As shown in FIG. 3, wire bonds 132 can be substantially straight along the longitudinal axis thereof, as in the embodiment of FIG. 1, with the longitudinal axis being angled at an angle 146 with respect to first surface 114 of substrate 112. Although the cross-sectional view of FIG. 3 only shows the angle 146 through a first plane perpendicular to first surface 114, wire bond 132 can also be angled with respect to first surface 114 in another plane perpendicular to both that first plane and to first surface 114. Such an angle can be substantially equal to or different than angle 146. That is the displacement of end 136 relative to base 134 can be in two lateral directions and can be by the same or a different distance in each of those directions.

Figure 4:
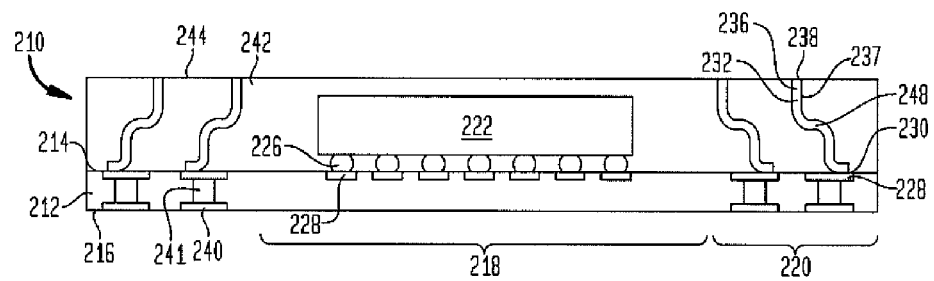
FIG. 4 is a sectional view depicting a microelectronic package according to a variation of the embodiment shown in FIG. 1.
Figure 8:
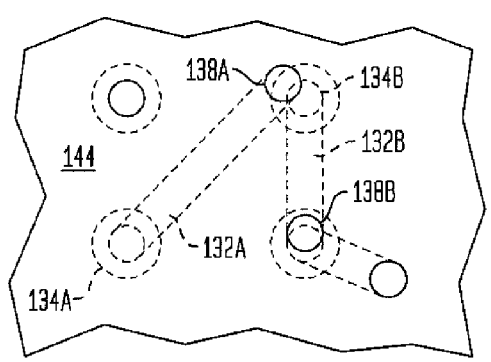
FIG. 8 is a fragmentary top elevation view further illustrating a microelectronic package according to an embodiment of the invention.

In an embodiment, various ones of wire bonds 132 can be displaced in different directions and by different amounts throughout the assembly 110. Such an arrangement allows for assembly 110 to have an array that is configured differently on the level of surface 144 compared to on the level of substrate 12. For example, an array can cover a smaller overall area or have a smaller pitch on surface 144 compared to that at first surface 114 of substrate 112. Further, some wire bonds 132 can have ends 138 that are positioned above microelectronic element 122 to accommodate a stacked arrangement of packaged microelectronic elements of different sizes. In another example, wire bonds 132 can be configured such that the end of one wire bond is positioned substantially above the base of a second wire bond, wherein the end of that second wire bond being positioned elsewhere. Such an arrangement can be referred to as changing the relative position of a contact end surface 136 within an array of contacts, compared to the position of a corresponding contact array on second surface 116. In another example, shown in FIG. 8, wire bonds 132 can be configured such that the end 136A of one wire bond 132A is positioned substantially above the base 134B of another wire bond 134B, the end 132B of that wire bond 134B being positioned elsewhere. Such an arrangement can be referred to as changing the relative position of a contact end surface 136 within an array of contacts, compared to the position of a corresponding contact array on second surface 116. Within such an array, the relative positions of the contact end surfaces can be changed or varied, as desired, depending on the microelectronic assembly's application or other requirements. FIG. 4 shows a further embodiment of a microelectronic subassembly 210 having wire bonds 232 with ends 236 in displaced lateral positions with respect to bases 234. In the embodiment of FIG. 4, the wire bonds 132 achieve this lateral displacement by including a curved portion 248 therein. Curved portion 248 can be formed in an additional step during the wire bond formation process and can occur, for example, while the wire portion is being drawn out to the desired length. This step can be carried out using available wire-bonding equipment, which can include the use of a single machine.

Curved portion 248 can take on a variety of shapes, as needed, to achieve the desired positions of the ends 236 of the wire bonds 232. For example, curved portions 248 can be formed as S-curves of various shapes, such as that which is shown in FIG. 4 or of a smoother form (such as that which is shown in FIG. 5). Additionally, curved portion 248 can be positioned closer to base 234 than to end 236 or vice-versa. Curved portion 248 can also be in the form of a spiral or loop, or can be compound including curves in multiple directions or of different shapes or characters.

Figure 26:
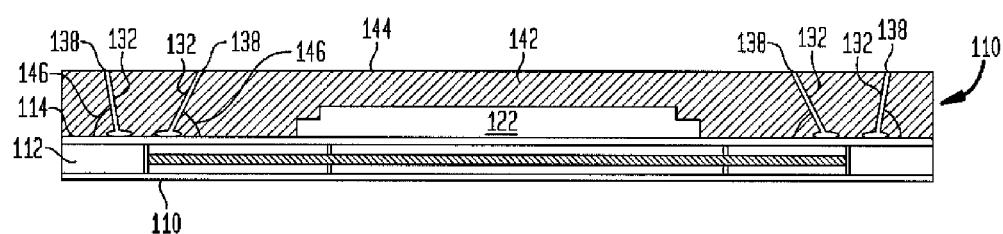
FIG. 26 shows a sectional view of a microelectronic package according to another embodiment.

In a further example shown in FIG. 26, the wire bonds 132 can be arranged such that the bases 134 are arranged in a first pattern having a pitch thereof. The wire bonds 132 can be configured such that the unencapsulated portions thereof 139 including end surfaces 138, can be disposed at positions in a pattern having a minimum pitch between adjacent unencapsulated portions 38 of the wire bonds 32 exposed at the surface 44 of the encapsulation layer that is greater than the minimum pitch between adjacent bases of the plurality of bases 134 and, accordingly, the conductive elements 128 to which the bases are joined). To achieve this, the wire bonds can include portions which extend in one or more angles relative to a normal direction to the conductive elements, such as shown in FIG. 26. In another example, the wire bonds can be curved as shown, for example in FIG. 4, such that the ends 238 are displaced in one or more lateral directions from the bases 134, as discussed above. As further shown in FIG. 26, the conductive elements 128 and the ends 138 can be arranged in respective rows or columns and the lateral displacement of end surfaces 138 at some locations, such as in one row of the ends, from the respective conductive elements on the substrate to which they are joined can be greater than the lateral displacement of the unencapsulated portions at other locations from the respective conductive elements to which they are connected. To achieve this, the wire bonds 132 can, for example be at different angles 146A, 146B with respect to the surface 116 of the substrate 112.

Figure 5A:
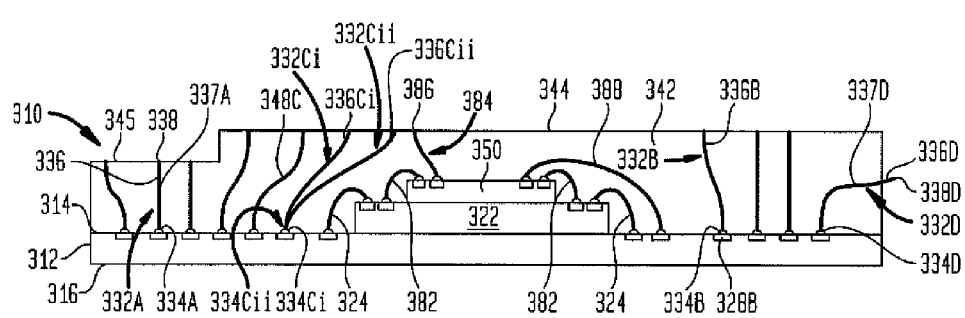
FIG. 5A is a sectional view depicting a microelectronic package according to a variation of the embodiment shown in FIG. 1.

FIG. 5A shows a further exemplary embodiment of a microelectronic package 310 having a combination of wire bonds 332 having various shapes leading to various relative lateral displacements between bases 334 and ends 336. Some of wire bonds 332A are substantially straight with ends 336A positioned above their respective bases 334A, while other wire bonds 332B include a subtle curved portion 348B leading to a somewhat slight relative lateral displacement between end 336B and base 334B. Further, some wire bonds 332C include curved portions 348C having a sweeping shape that result in ends 336C that are laterally displaced from the relative bases 334C at a greater distance than that of ends 334B. FIG. 5 also shows an exemplary pair of such wire bonds 332Ci and 332Cii that have bases 334Ci and 334Cii positioned in the same row of a substrate-level array and ends 336Ci and 336Cii that are positioned in different rows of a corresponding surface-level array. In some cases, the radius of bends in the wire bonds 332Ci, 332Cii can be large such that the curves in the wire bonds may appear continuous. In other cases, the radius of the bends may be relatively small, and the wire bonds may even have straight portions or relatively straight portions between bends in the wire bonds. Moreover, in some cases the unencapsulated portions of the wire bonds can be displaced from their bases by at least one minimum pitch between the contacts 328 of the substrate. In other cases, the unencapsulated portions of the wire bonds can be displaced from their bases by at least 200 micrometers.

A further variation of a wire bond 332D is shown that is configured to be uncovered by encapsulation layer 342 on a side surface 47 thereof. In the embodiment shown free end 336D is uncovered, however, a portion of edge surface 337D can additionally or alternatively be uncovered by encapsulation layer 342. Such a configuration can be used for grounding of microelectronic assembly 10 by electrical connection to an appropriate feature or for mechanical or electrical connection to other featured disposed laterally to microelectronic assembly 310. Additionally, FIG. 5 shows an area of encapsulation layer 342 that has been etched away, molded, or otherwise formed to define a recessed surface 345 that is positioned closer to substrate 12 than major surface 342. One or more wire bonds, such as wire bond 332A can be uncovered within an area along recessed surface 345. In the exemplary embodiment shown in FIG. 5, end surface 338A and a portion of edge surface 337A are uncovered by encapsulation layer 342. Such a configuration can provide a connection, such as by a solder ball or the like, to another conductive element by allowing the solder to wick along edge surface 337A and join thereto in addition to joining to end surface 338. Other configurations by which a portion of a wire bond can be uncovered by encapsulation layer 342 along recessed surface 345 are possible, including ones in which the end surfaces are substantially flush with recessed surface 345 or other configurations shown herein with respect to any other surfaces of encapsulation layer 342.

Similarly, other configurations by which a portion of wire bond 332D is uncovered by encapsulation layer 342 alongside surface 347 can be similar to those discussed elsewhere herein with respect to the variations of the major surface of the encapsulation layer.

FIG. 5A further shows a microelectronic assembly 310 having two microelectronic elements 322 and 350 in an exemplary arrangement where microelectronic element 350 is stacked, face-up, on microelectronic element 322. In this arrangement, leads 324 are used to electrically connect microelectronic element 322 to conductive features on substrate 312. Various leads are used to electronically connect microelectronic element 350 to various other features of microelectronic assembly 310. For example, lead 380 electrically connects microelectronic element 350 to conductive features of substrate 312, and lead 382 electrically connects microelectronic element 350 to microelectronic element 322. Further, wire bond 384, which can be similar in structure to various ones of wire bonds 332, is used to form a contact surface 386 on the surface 344 of encapsulation layer 342 that electrically connected to microelectronic element 350. This can be used to directly electrically connect a feature of another microelectronic assembly to microelectronic element 350 from above encapsulation layer 342. Such a lead could also be included that is connected to microelectronic element 322, including when such a microelectronic element is present without a second microelectronic element 350 affixed thereon. An opening (not shown) can be formed in encapsulation layer 342 that extends from surface 344 thereof to a point along, for example, lead 380, thereby providing access to lead 380 for electrical connection thereto by an element located outside surface 344. A similar opening can be formed over any of the other leads or wire bonds 332, such as over wire bonds 332C at a point away from the ends 336C thereof. In such an embodiment, ends 336C can be positioned beneath surface 344, with the opening providing the only access for electrical connection thereto.

Figure 27A:
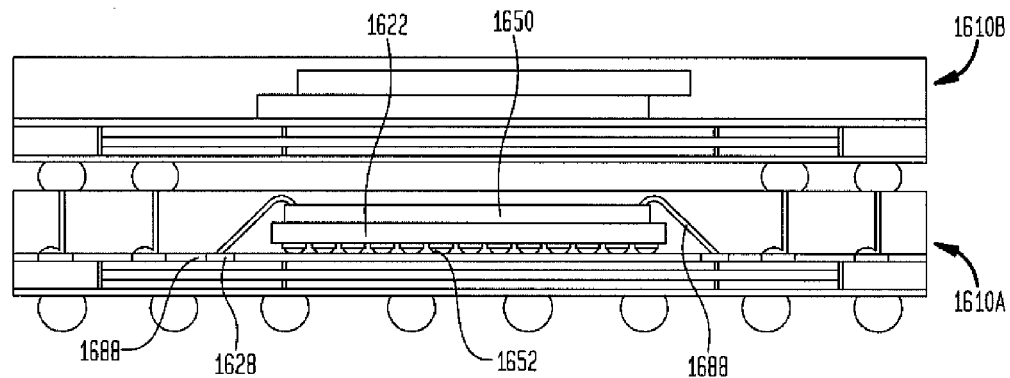
FIGS. 27A-C are sectional views showing examples of embodiments of microelectronic packages according to further embodiments.
Figure 27B:
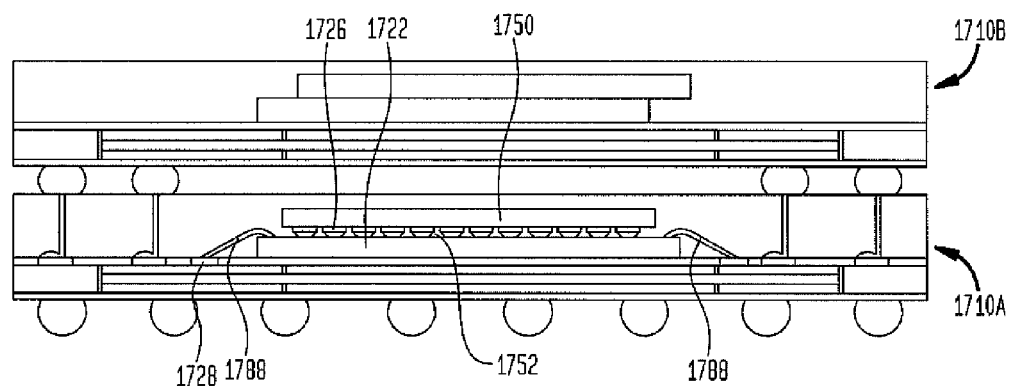
Figure 27C:
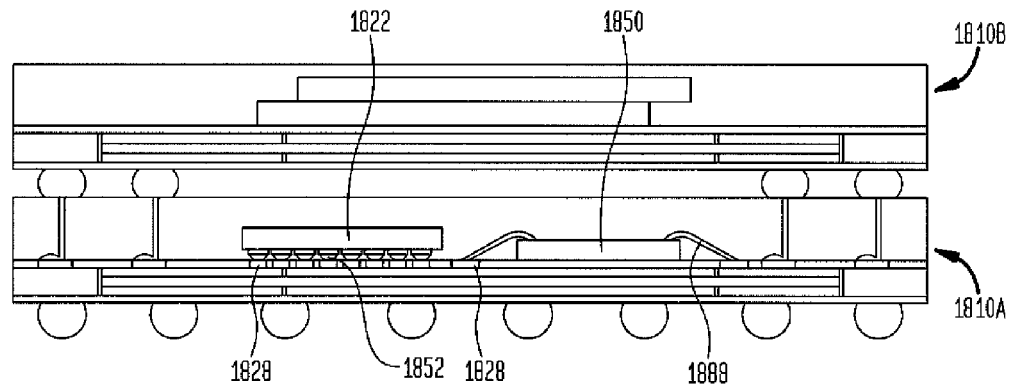

Additional arrangements for microelectronic packages having multiple microelectronic elements are shown in FIGS. 27A-C. These arrangements can be used in connection with the wire bond arrangements shown, for example in FIG. 5A and in the stacked package arrangement of FIG. 6, discussed further below. Specifically, FIG. 27A shows an arrangement in which a lower microelectronic element 1622 is flip-chip bonded to conductive elements 1628 on the surface 1614 of substrate 1612. The second microelectronic element 1650 can overlie the first microelectronic element 1622 and be face-up connected to additional conductive elements 1628 on the substrate, such as through wire bonds 1688. FIG. 27B shows an arrangement where a first microelectronic element 1722 is face-up mounted on surface 1714 and connected through wire bonds 1788 to conductive elements 1728. Second microelectronic element 1750 can have contacts exposed at a face thereof which face and are joined to corresponding contacts at a face of the first microelectronic element 1722 which faces away from the substrate. through a set of contacts 1726 of the second microelectronic element 1750 which face and are joined to corresponding contacts on the front face of the first microelectronic element 1722. These contacts of the first microelectronic element 1722 which are joined to corresponding contacts of the second microelectronic element can in turn be connected through circuit patterns of the first microelectronic element 1722 and be connected by ire bonds 1788 to the conductive elements 1728 on substrate 1712.

FIG. 27C shows an example in which first and second microelectronic elements 1822, 1850 are spaced apart from one another in a direction along a surface 1814 of substrate 1812. Either one or both of the microelectronic elements (and additional microelectronic elements) can be mounted in face-up or flip-chip configurations described herein. Further, any of the microelectronic elements employed in such an arrangement can be connected to each other through circuit patterns on one or both such microelectronic elements or on the substrate or on both, which electrically connect respective conductive elements 1828 to which the microelectronic elements are electrically connected.

Figure 5B:
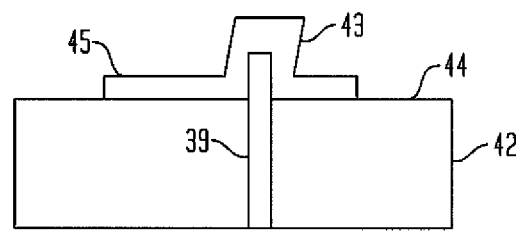
FIG. 5B is a fragmentary sectional view depicting a conductive element formed on an unencapsulated portion of a wire bond according to an embodiment of the invention.

FIG. 5B further illustrates a structure according to a variation of the above-described embodiments in which a second conductive element 43 can be formed in contact with an unencapsulated portion 39 of a wire bond exposed at or projecting above a surface 44 of the encapsulation layer 42, the second conductive element not contacting the first conductive element 28 (FIG. 1). In one embodiment as seen in FIG. 5B, the second conductive element can include a pad 45 extending onto a surface 44 of the encapsulation layer which can provide a surface for joining with a bonding metal or bonding material of a component thereto.

Figure 5C:
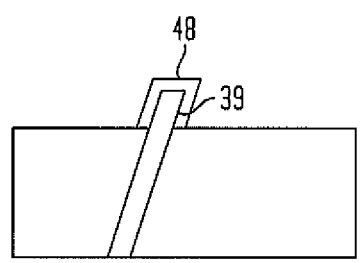
FIG. 5C is a fragmentary sectional view depicting a conductive element formed on an unencapsulated portion of a wire bond according to a variation of that shown in FIG. 5B.

Alternatively, as seen in FIG. 5C, the second conductive element 48 can be a metallic finish selectively formed on the unencapsulated portion 39 of a wire bond. In either case, in one example, the second conductive element 43 or 48 can be formed, such as by plating, of a layer of nickel contacting the unencapsulated portion of the wire bond and overlying a core of the wire bond, and a layer of gold or silver overlying the layer of nickel. In another example, the second conductive element may be a monolithic metal layer consisting essentially of a single metal. In one example, the single metal layer can be nickel, gold, copper, palladium or silver. In another example, the second conductive element 43 or 48 can include or be formed of a conductive paste contacting the unencapsulated portion 39 of the wire bond. For example, stenciling, dispensing, screen printing, controlled spraying, e.g., a process similar to inkjet printing, or transfer molding can be used to form second conductive elements 43 or 48 on the unencapsulated portions 39 of the wire bonds.

Figure 5D:
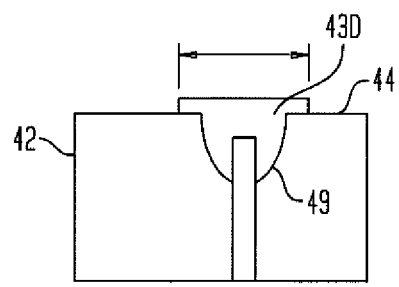
FIG. 5D is a fragmentary sectional view depicting a conductive element formed on an unencapsulated portion of a wire bond according to a variation of that shown in FIG. 5B.

FIG. 5D further illustrates a second conductive element 43D which can be formed of a metal or other electrically conductive material as described for conductive elements 43, 48 above, wherein the second conductive element 43D is formed at least partly within an opening 49 extending into an exterior surface 44 of the encapsulation layer 42. In one example, the opening 49 can be formed by removing a portion of the encapsulation layer after curing or partially curing the encapsulation layer so as to simultaneously expose a portion of the wire bond thereunder which then becomes the unencapsulated portion of the wire bond. For example, the opening 49 can be formed by laser ablation, etching. In another example, a soluble material can be pre-placed at the location of the opening prior to forming the encapsulation layer and the pre-placed material then can be removed after forming the encapsulation layer to form the opening.

Figure 24A:
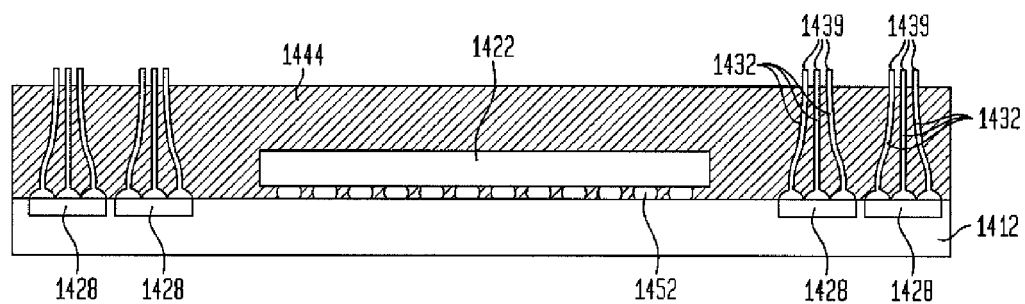
FIGS. 24A and 24B are sectional views of a microelectronic package according to a further embodiment.
Figure 24B:
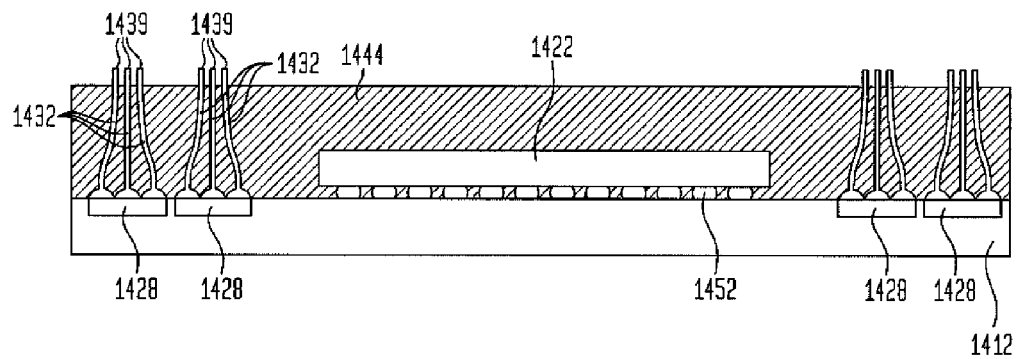

In a further example, as seen in FIGS. 24A-24B, multiple wire bonds 1432 can have bases joined with a single conductive element 1428. Such a group of wire bonds 1432 can be used to make additional connection points over the encapsulation layer 1442 for electrical connection with conductive element 1428. The exposed portions 1439 of the commonly-joined wire bonds 1432 can be grouped together on surface 1444 of encapsulation layer 1442 in an area, for example about the size of conductive element 1428 itself or another area approximating the intended size of a bonding mass for making an external connection with the wire bond 1432 group. As shown, such wire bonds 1432 can be either ball-bonded (FIG. 24A) or edge bonded (FIG. 24B) on conductive element 1428, as described above, or can be bonded to the conductive element as described above with respect to FIG. 23A or 23B or both.

Figure 25A:
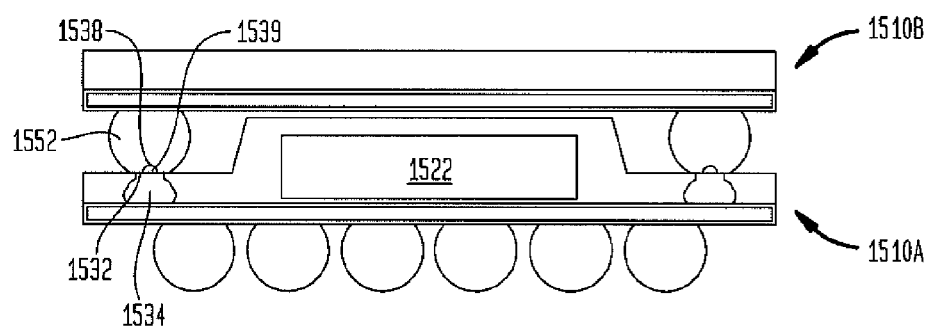
FIGS. 25A and 25B are sectional views of a microelectronic package according to a further embodiment.
Figure 25B:
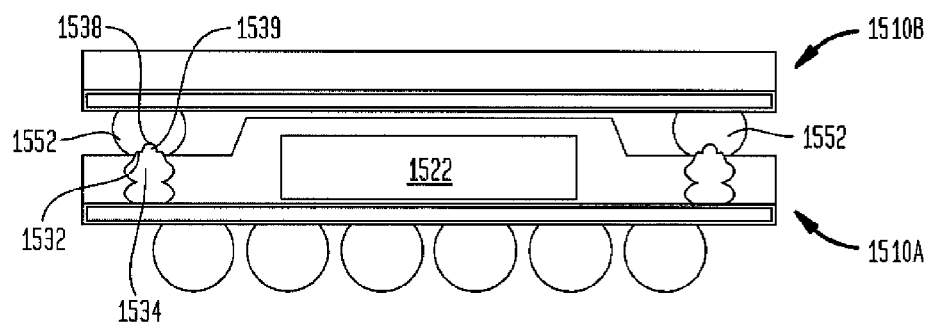

As shown in FIGS. 25A and 25B, ball-bonded wire bonds 1532 can be formed as stud bumps on at least some of the conductive elements 1528. As described herein a stud bump is a ball-bonded wire bond where the segment of wire extending between the base 1534 and the end surface 1538 has a length of at most 300% of the diameter of the ball-bonded base 1534. As in other embodiments, the end surface 1538 and optionally a portion of the edge surface 1537 of the stud bump can be unencapsulated by the encapsulation layer 1542. As shown in FIG. 25B such a stud bump 1532A can be formed on top of another stud bump 1532B to form, essentially, a base 1534 of a wire bond 1532 made up of the two ball bonds with a wire segment extending therefrom up to the surface 1544 of the encapsulation layer 1542. Such wire bonds 1532 can have a height that is less than, for example, the wire bonds described elsewhere in the present disclosure. Accordingly, the encapsulation layer can include a major surface 1544 in an area, for example overlying the microelectronic element 1522 and a minor surface 1545 spaced above the surface 1514 of the substrate 1512 at a height less than that of the major surface 1544. Such arrangements can also be used to form alignment features and to reduce the overall height of a package employing stud bump type wire bonds as well as other types of wire bonds disclosed herein, while accommodating conductive masses 1552 that can connect the unencapsulated portions 1539 of the wire bonds 1532 with contacts 1543 on another microelectronic package 1588.

FIG. 6 shows a stacked package of microelectronic assemblies 410 and 488. In such an arrangement solder masses 452 electrically and mechanically connect end surfaces 438 of assembly 410 to conductive elements 440 of assembly 488. The stacked package can include additional assemblies and can be ultimately attached to contacts 492 on a PCB 490 or the like for use in an electronic device. In such a stacked arrangement, wire bonds 432 and conductive elements 430 can carry multiple electronic signals therethrough, each having a different signal potential to allow for different signals to be processed by different microelectronic elements, such as microelectronic element 422 or microelectronic element 489, in a single stack.

Figure 7:
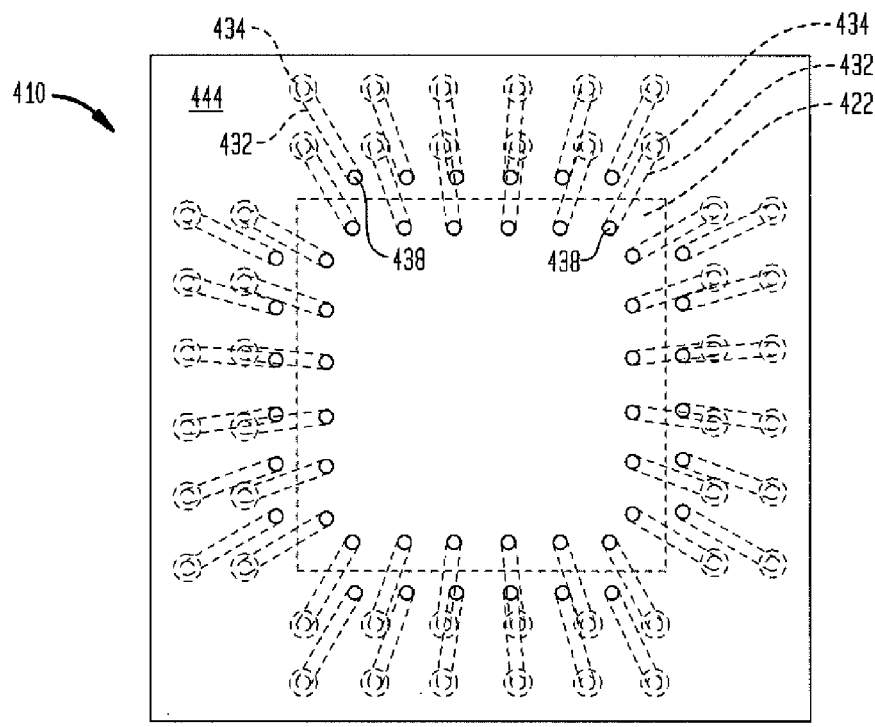
FIG. 7 is a top elevation view illustrating a microelectronic package according to an embodiment of the invention.

In the exemplary configuration in FIG. 6, wire bonds 432 are configured with a curved portion 448 such that at least some of the ends 436 of the wire bonds 432 extend into an area that overlies a major surface 424 of the microelectronic element 422. Such an area can be defined by the outer periphery of microelectronic element 422 and extending upwardly therefrom. An example of such a configuration is shown from a view facing toward first surface 414 of substrate 412 in FIG. 18, where wire bonds 432 overlie a rear major surface of the microelectronic element 422, which is flip-chip bonded at a front face 425 thereof to substrate 412. In another configuration (FIG. 5), the microelectronic element 422 can be mounted face-up to the substrate 312, with the front face 325 facing away from the substrate 312 and at least one wire bond 336 overlying the front face of microelectronic element 322. In one embodiment, such wire bond 336 is not electrically connected with microelectronic element 322. A wire bond 336 bonded to substrate 312 may also overlie the front or rear face of microelectronic element 350. The embodiment of microelectronic assembly 410 shown in FIG. 7 is such that conductive elements 428 are arranged in a pattern forming a first array in which the conductive elements 428 are arranged in rows and columns surrounding microelectronic element 422 and may have a predetermined pitch between individual conductive elements 428. Wire bonds 432 are joined to the conductive elements 428 such that the respective bases 434 thereof follow the pattern of the first array as set out by the conductive elements 428. Wire bonds 432 are configured, however, such that the respective ends 436 thereof can be arranged in a different pattern according to a second array configuration. In the embodiment shown the pitch of the second array can be different from, and in some cases finer than that of the first array. However, other embodiments are possible in which the pitch of the second array is greater than the first array, or in which the conductive elements 428 are not positioned in a predetermined array but the ends 436 of the wire bonds 432 are. Further still, conductive elements 428 can be configured in sets of arrays positioned throughout substrate 412 and wire bonds 432 can be configured such that ends 436 are in different sets of arrays or in a single array.

FIG. 6 further shows an insulating layer 421 extending along a surface of microelectronic element 422. Insulating layer 421 can be formed from a dielectric or other electrically insulating material prior to forming the wire bonds. The insulating layer 421 can protect microelectronic element from coming into contact with any of wire bonds 423 that extend thereover. In particular, insulating layer 421 can avoid electrical short-circuiting between wire bonds and short-circuiting between a wire bond and the microelectronic element 422. In this way, the insulating layer 421 can help avoid malfunction or possible damage due to unintended electrical contact between a wire bond 432 and the microelectronic element 422.

The wire bond configuration shown in FIGS. 6 and 7 can allow for microelectronic assembly 410 to connect to another microelectronic assembly, such as microelectronic assembly 488, in certain instances where the relative sizes of, for example, microelectronic assembly 488 and microelectronic element 422 would not otherwise permit. In the embodiment of FIG. 6 microelectronic assembly 488 is sized such that some of the contact pads 440 are in an array within an area smaller than the area of the front or rear surface 424 or 426 of the microelectronic element 422. In a microelectronic assembly having substantially vertical conductive features, such as pillars, in place of wire bonds 432, direct connection between conductive elements 428 and pads 440 would not be possible. However, as shown in FIG. 6, wire bonds 432 having appropriately-configured curved portions 448 can have ends 436 in the appropriate positions to make the necessary electronic connections between microelectronic assembly 410 and microelectronic assembly 488. Such an arrangement can be used to make a stacked package where microelectronic assembly 418 is, for example, a DRAM chip or the like having a predetermined pad array, and wherein microelectronic element 422 is a logic chip configured to control the DRAM chip. This can allow a single type of DRAM chip to be used with several different logic chips of varying sizes, including those which are larger than the DRAM chip because the wire bonds 432 can have ends 436 positioned wherever necessary to make the desired connections with the DRAM chip. In an alternative embodiment, microelectronic package 410 can be mounted on printed circuit board 490 in another configuration, where the unencapsulated surfaces 436 of wire bonds 432 are electrically connected to pads 492 of circuit board 490. Further, in such an embodiment, another microelectronic package, such as a modified version of package 488 can be mounted on package 410 by solder balls 452 joined to pads 440.

Figure 9:
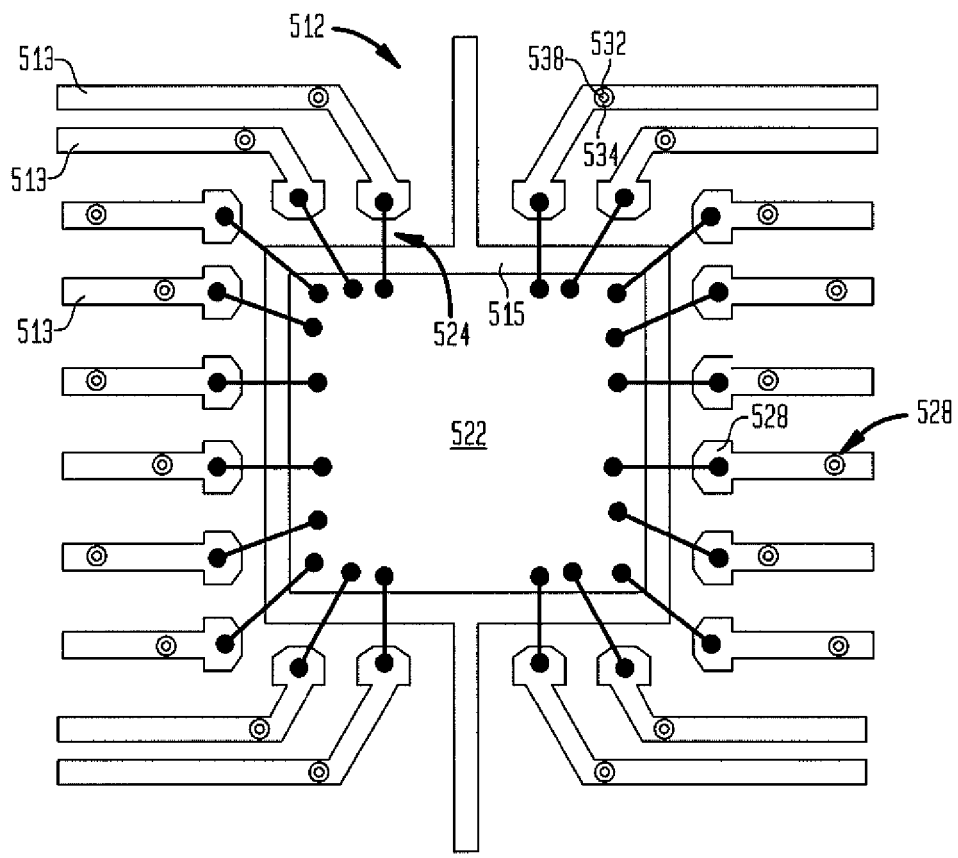
FIG. 9 is a top elevation view illustrating a microelectronic package including a lead frame type substrate according to an embodiment of the invention.
Figure 10:
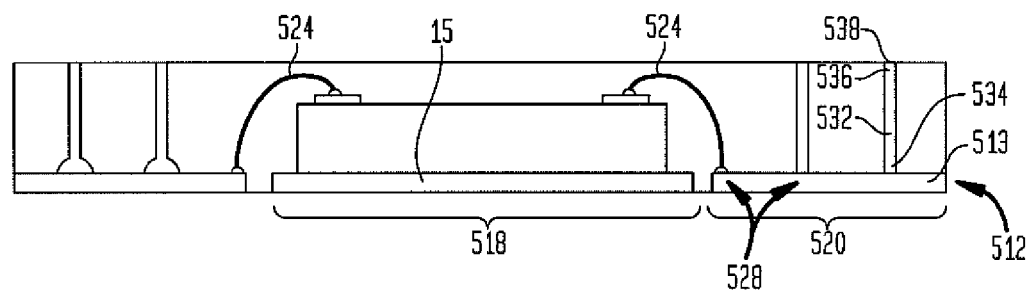
FIG. 10 is a corresponding sectional view of the microelectronic package shown in FIG. 9.

FIGS. 9 and 10 show a further embodiment of a microelectronic assembly 510 in which wire bonds 532 are formed on a lead-frame structure. Examples of lead frame structures are shown and described in U.S. Pat. Nos. 7,176,506 and 6,765,287 the disclosures of which are hereby incorporated by reference herein. In general, a lead frame is a structure formed from a sheet of conductive metal, such as copper, that is patterned into segments including a plurality of leads and can further include a paddle, and a frame. The frame is used to secure the leads and the paddle, if used, during fabrication of the assembly. In an embodiment, a microelectronic element, such as a die or chip, can be joined face-up to the paddle and electrically connected to the leads using wire bonds. Alternatively, the microelectronic element can be mounted directly onto the leads, which can extend under the microelectronic element. In such an embodiment, contacts on the microelectronic element can be electrically connected to respective leads by solder balls or the like. The leads can then be used to form electrical connections to various other conductive structures for carrying an electronic signal potential to and from the microelectronic element. When the assembly of the structure is complete, which can include forming an encapsulation layer thereover, temporary elements of the frame can be removed from the leads and paddle of the lead frame, so as to form individual leads. For purposes of this disclosure, the individual leads 513 and the paddle 515 are considered to be segmented portions of what, collectively, forms a substrate 512 that includes conductive elements 528 in portions that are integrally formed therewith. Further, in this embodiment, paddle 515 is considered to be within first region 518 of substrate 512, and leads 513 are considered to be within second region 520. Wire bonds 524, which are also shown in the elevation view of FIG. 10, connect microelectronic element 22, which is carried on paddle 515, to conductive elements 528 of leads 515. Wire bonds 532 can be further joined at bases 534 thereof to additional conductive elements 528 on leads 515. Encapsulation layer 542 is formed onto assembly 510 leaving ends 538 of wire bonds 532 uncovered at locations within surface 544. Wire bonds 532 can have additional or alternative portions thereof uncovered by encapsulation layer 542 in structures that correspond to those described with respect to the other embodiments herein.

Figure 11:
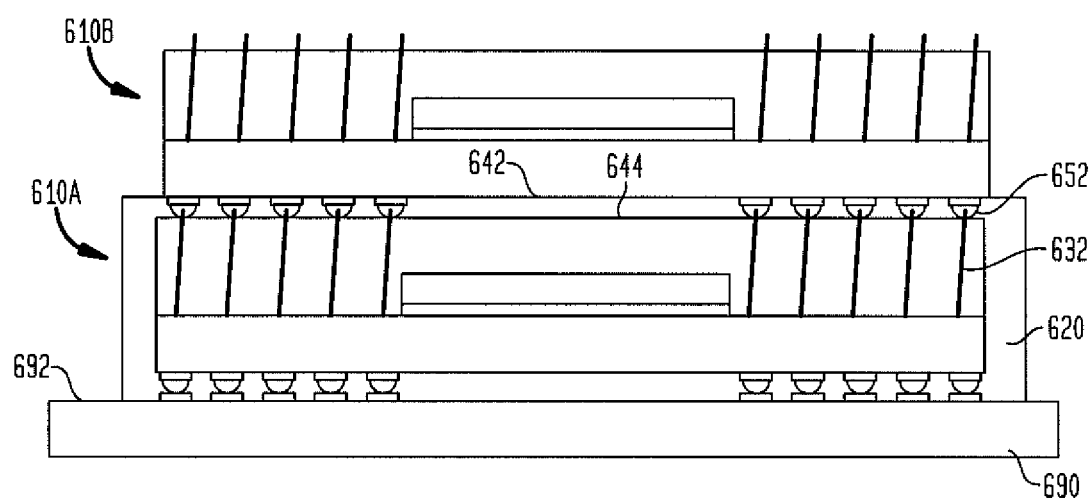
FIG. 11 is a sectional view of a microelectronic assembly including a plurality of microelectronic packages electrically connected together and reinforced with an underfill according to a variation of the embodiment shown in FIG. 6.

FIG. 11 further illustrates use of an underfill 620 for mechanically reinforcing the joints between wire bonds 632 of one package 610A and solder masses 652 of another package 610B mounted thereon. As shown in FIG. 11, although the underfill 620 need only be disposed between confronting surfaces 642, 644 of the packages 610A, 610B, the underfill 620 can contact edge surfaces of package 610A and may contact a first surface 692 of the circuit panel 690 to which the package 610 is mounted. Further, portions of the underfill 620 that extend along the edge surfaces of the packages 610A, 610B, if any, can be disposed at an angle between 0° and 90° relative to a major surface of the circuit panel over which the packages are disposed, and can be tapered from a greater thickness adjacent the circuit panel to a smaller thickness at a height above the circuit panel and adjacent one or more of the packages.

Figure 28A:
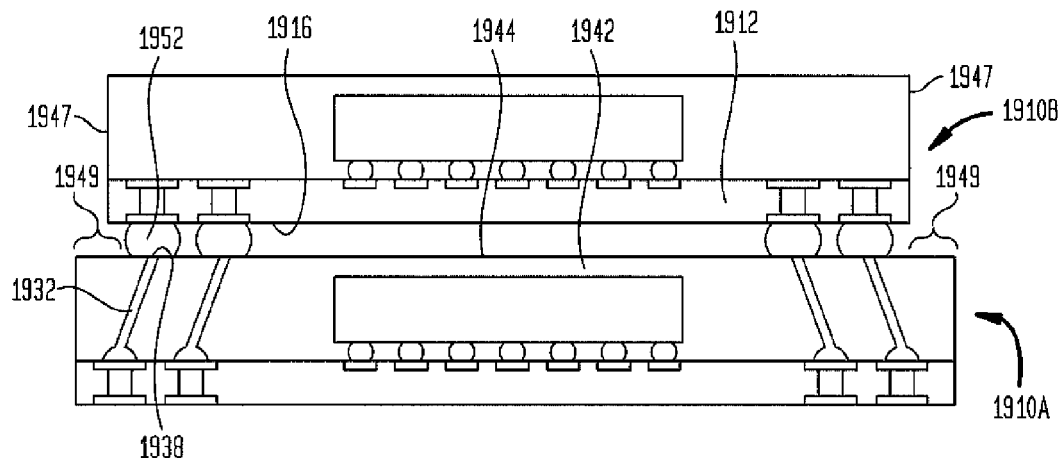
FIGS. 28A-D show various embodiments of microelectronic packages during steps of forming a microelectronic assembly according to an embodiment of the disclosure.
Figure 28B:
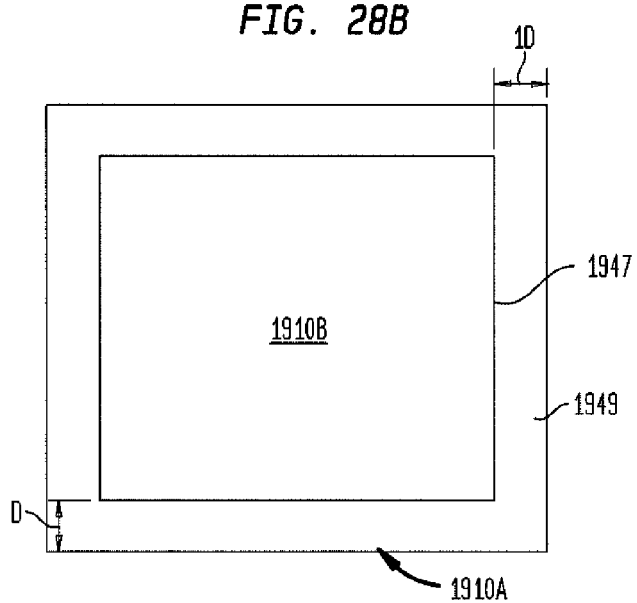
Figure 28C:
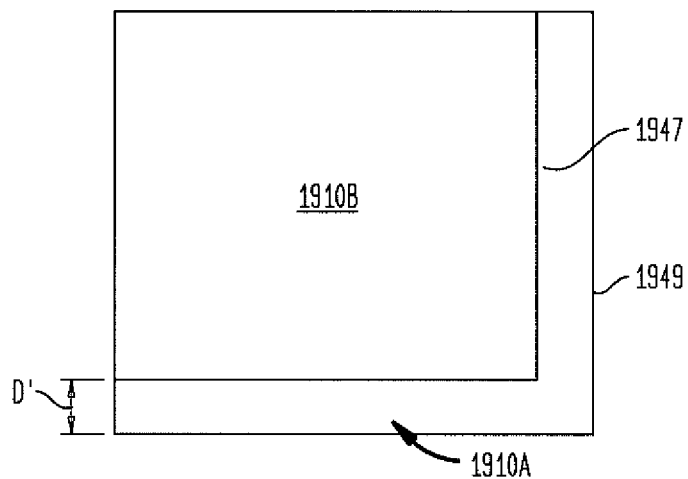
Figure 28D:
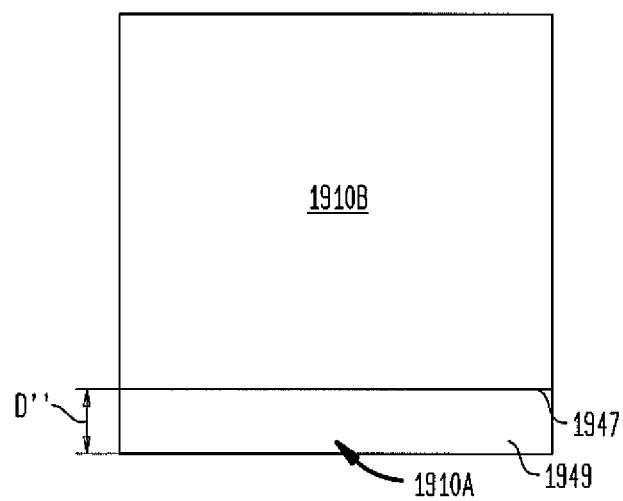

A package arrangement shown in FIGS. 28A-D can be implemented in one technique for making an underfill layer, and in particular a portion thereof that is disposed between confronting faces of packages 1910A and 1910B, such as surface 1942 of package 1910A and surface 1916 of package 1910B. As shown in FIG. 28A, package 1910A can extend beyond an edge surface 1947 of package 1910B such that, for example, the surface 1944 of encapsulation layer 1942 has a portion thereof that is exposed outside of package 1910B. Such an area can be used as a dispensing area 1949 whereby a device can deposit an underfill material in a flowable state on the dispensing area from a vertical position relative thereto. In such an arrangement, the dispensing area 1949 can be sized such that the underfill material can be deposited in a mass on the surface without spilling off of the edge of the surface while reaching a sufficient volume to flow under package 1910B where it can be drawn by capillary into the area between the confronting surfaces of packages 1910A and 1910B, including around any joints therebetween, such as solder masses or the like. As the underfill material is drawn between confronting surfaces, additional material can be deposited on the dispensing area such that a continuous flow is achieved that does not significantly spill over the edge of package 1910A. As shown in FIG. 28B, the dispensing area 1949 can surround package 1910B and have a dimension D in an orthogonal direction away from a peripheral edge of package 1910B of about one millimeter (1 mm) on each side thereof. Such an arrangement can allow for dispensing on one side of package 1910B or more than one side, either sequentially or simultaneously. Alternative arrangements are shown in FIG. 28C, wherein the dispensing area 1949 extends along only two adjacent sides of package 1910B and have a dimension D' of about 1 mm in a direction orthogonally away from a peripheral edge of the second package, and FIG. 28D, wherein the dispensing area 1949 extends along a single side of package 1910B and may have a dimension D" in an orthogonal direction away from the peripheral edge of the package of, for example 1.5 mm to 2 mm.

Figure 29:
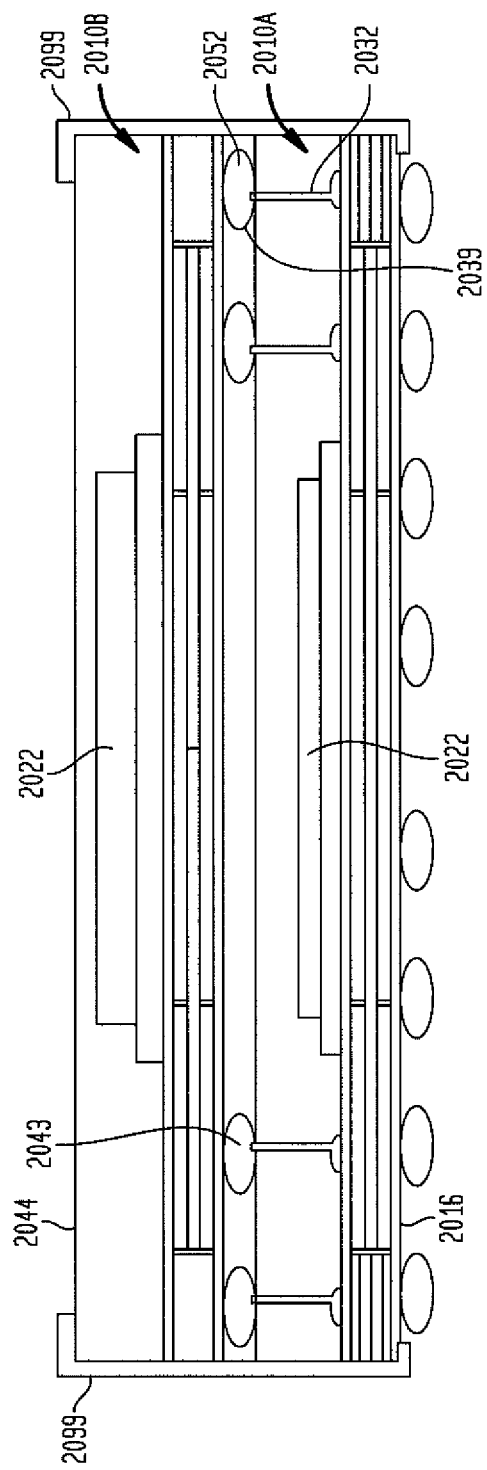
FIG. 29 shows another embodiment of microelectronic packages during steps of forming a microelectronic assembly according to an embodiment of the disclosure.

In an arrangement where microelectronic packages 2010A and 2010B are of similar sizes in a horizontal profile, a compliant bezel 2099 can be used to secure the packages 2010A and 2010B together during attachment by, for example, joining of terminals of the second package with the elements comprising the unencapsulated portions 2039 of the wire bonds 2032, e.g., by heating or curing of conductive masses 2052, e.g., reflowing of solder masses, to join the packages 2010A and 2010B together. Such an arrangement is shown in FIG. 29 in which package 2010B is assembled over package 2010A with conductive masses 2052, e.g., solder masses, for example, joined to terminals 2043 on package 2010B. The packages can be aligned so that the solder masses 2052 align with unencapsulated portions 2039 of the wire bonds 2032 of package 2010A or with second conductive elements joined with the end surfaces 2038 of the wire bonds 2032, as described above. The bezel 2099 can then be assembled around packages 2010A and 2010B to maintain such alignment during a heating process in which the terminals of the second package are joined with the wire bonds 2032 or second conductive elements of the first package. For example, a heating process can be used to reflow solder masses 2052 to bond the terminals of the second package with the wire bonds 2032 or second conductive elements. Bezel 2099 can also extend inward along portions of surface 2044 of package 2010B and along surface 2016 of package 2010A to maintain the contact between the packages before and during reflow. The bezel 2099 can be of a resiliently compliant material such as rubber, TPE, PTFE (polytetrafluoroethylene), silicone or the like and can be undersized relative to the size of the assembled packages such that a compressive force is applied by the bezel when in place. The bezel 2099 can also be left in place during the application of an underfill material and can include an opening to accommodate such application therethrough. The compliant bezel 2099 can be removed after package assembly.

Figure 30A:
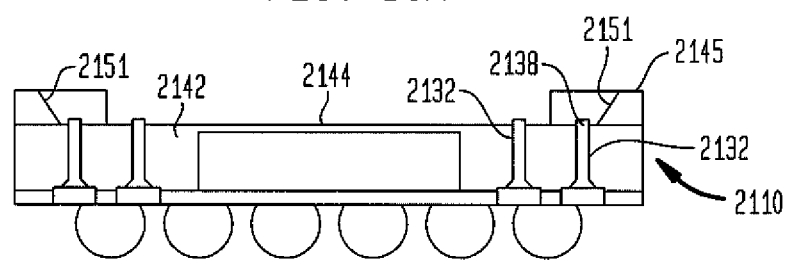
FIGS. 30A-C show embodiments of microelectronic packages during steps of forming a microelectronic assembly according to another embodiment of the disclosure.
Figure 30B:
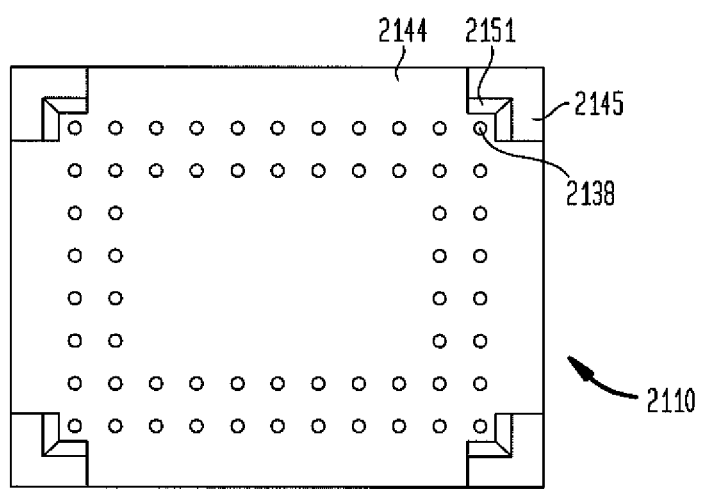
Figure 30C:
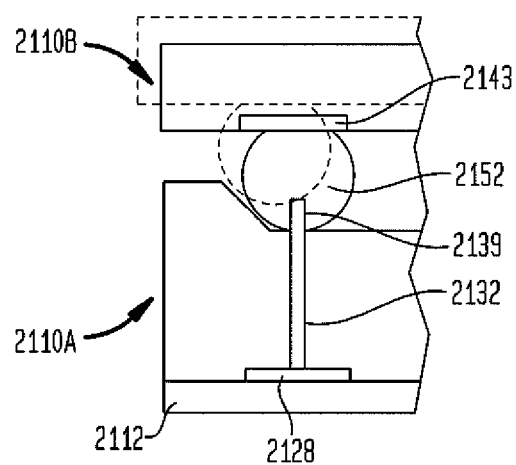

Additionally or alternatively, the assembly of microelectronic packages 2110A and 2110B, as shown in FIGS. 30A-F, a lower package 2110A can include at least one alignment surface 2151. One example of this is shown in FIG. 30A in which alignment surfaces 2151 are included in encapsulation layer 2142 near the corners of the package 2110B. The alignment surfaces are sloped relative to the major surface and define an angle of between about 0° and up to and including 90° relative to major surface 2144 at some location therefrom, the alignment surfaces extending locations proximate the major surface 2144 and respective minor surfaces 2145 that are spaced above substrate 2112 at a greater distance than major surface 2144. The minor surfaces 2145 can be disposed adjacent the corners of package 2110A and can extend partially between intersecting sides thereof. As shown in FIG. 30B, the alignment surfaces can also form inside corners opposite the intersecting sides of the package 2110A and can be included in similar form along all corners, for example four corners, of package 2110A. As illustrated in FIG. 30C, the alignment surfaces 2151 can be positioned at an appropriate distance from unencapsulated portions of corresponding wire bonds 2132 such that when a second package 2110B having protrusions, e.g., electrically conductive protrusions such as conductive masses or solder balls joined thereto is stacked on top of package 2110A, the alignment surfaces 2151 will guide the solder balls into the proper position overlying the unencapsulated portions of the wire bonds 2132 that correspond with the alignment surfaces 2151. The solder balls can then be reflowed to join with the unencapsulated portions of the wire bonds 2132 of package 2110A.

Figure 31A:
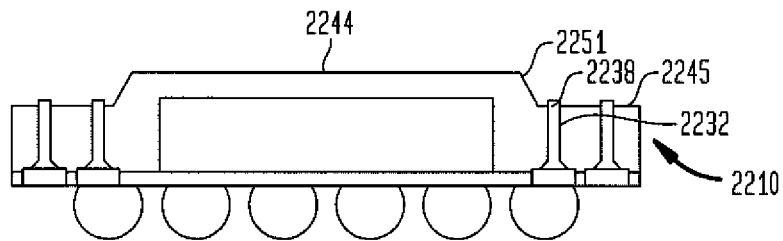
FIGS. 31A-C show embodiments of microelectronic packages during steps of forming a microelectronic assembly according to another embodiment of the disclosure.
Figure 31B:
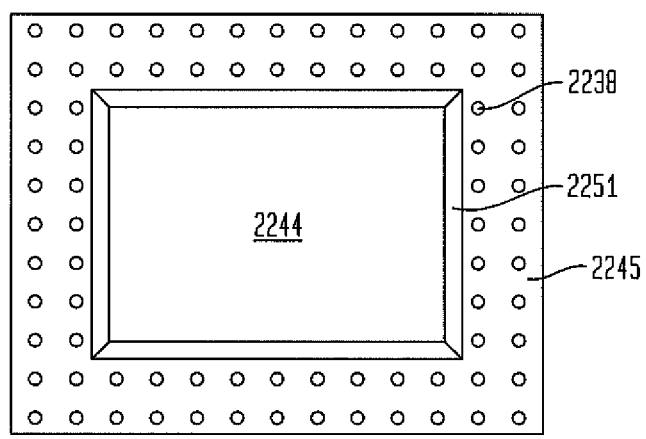
Figure 31C:
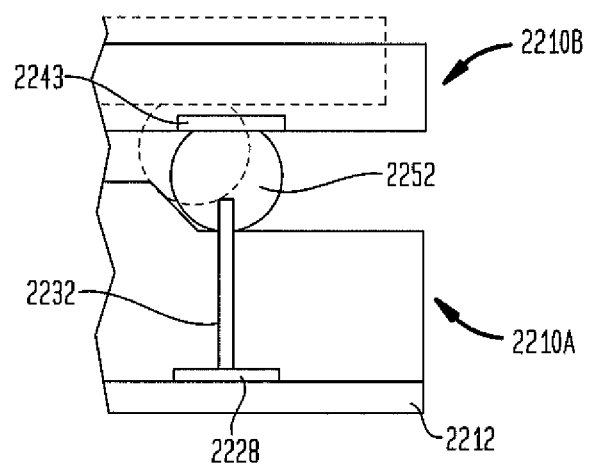

A further arrangement employing alignment surfaces 2251 is shown in FIGS. 31A-C, wherein the alignment surfaces 2251 extend between a raised inner surface 2244 to a lower outer surface 2245. In such an arrangement, inner surface 2244 can overlie microelectronic element 2222 and can be spaced above substrate 2212 accordingly. Outer surface 2245 can be spaced closer to substrate 2212 in a direction of the thickness of the substrate and can be positioned vertically between surface 2214 of substrate 2212 and surface 2223 of microelectronic element 2222. One or more unencapsulated portions of wire bonds 2232 can be positioned relative to the alignment surfaces 2251 to achieve alignment of solder balls 2252 or other conductive protrusion as described with respect to FIGS. 30A-C. As described above, such a stepped arrangement can be used with or without the described alignment functionality to achieve an overall lower assembly height given a certain bond mass size. Further, the incorporation of a raised inner surface 2244 can lead to increased resistance of package 2210A to warping.

Figure 12:
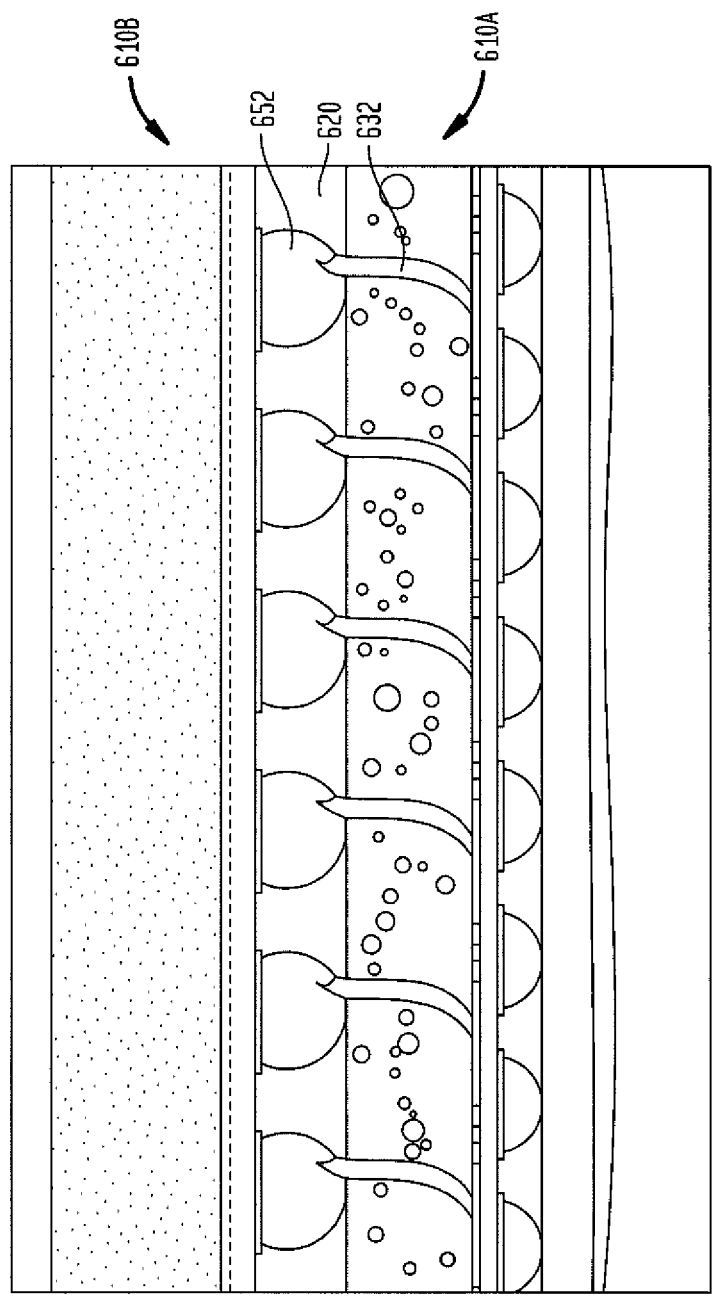
FIG. 12 is a photographic image representing an assembly having bonds between wire bonds of a first component and solder masses of a second component attached thereto.

FIG. 12 is a photographic image showing exemplary joints between the wire bonds 632 of a first component 610A and corresponding solder masses 652 of a second component such as a microelectronic package 610B. In FIG. 12, reference 620 indicates where an underfill can be disposed.

FIGS. 13A, 13B, 13C, 13D, 13E and 13F illustrate some possible variations in the structure of the wire bonds 32 as described above relative to FIG. 1. For example, as seen in FIG. 13A, a wire bond 732A may have an upwardly extending portion 736 which terminates in an end 738A having the same radius as the radius of portion 736.

FIG. 13B illustrates a variation in which the ends 738B are tips which are tapered relative to portion 736. In addition, as seen in FIG. 13C, a tapered tip 738B of a wire bond 732A may have a centroid 740 which is offset in a radial direction 741 from an axis of a cylindrical portion of the wire bond integral therewith. Such shape may be a bonding tool mark resulting from a process of forming the wire bond as will be described further below. Alternatively, a bonding tool mark other than as shown at 738B may be present on the unencapsulated portion of the wire bond. As further seen in FIG. 13A, the unencapsulated portion 739 of a wire bond may project away from the substrate 712 at an angle 750 within 25 degrees of perpendicular to the surface 730 of the substrate on which the conductive elements 728 are disposed.

FIG. 13D illustrates that an unencapsulated portion of a wire bond 732D can include a ball-shaped portion 738D. Some of all of the wire bonds on the package can have such structure. As seen in FIG. 13D, the ball-shaped portion 738D can be integral with a cylindrical portion 736 of the wire bond 732D, wherein the ball-shaped portion and at least a core of the cylindrical portion of the wire bond consist essentially of copper, copper alloy or gold. As will be described further below, the ball-shaped portion can be formed by melting a portion of the wire exposed at an opening of the capillary of the bonding tool during a pre-shaping process before stitch-bonding the wire bond to a conductive element 728 of the substrate. As seen in FIG. 13D, the diameter 744 of the ball-shaped portion 738D may be greater than the diameter 746 of the cylindrical wire bond portion 736 that is integral therewith. In a particular embodiment such as shown in FIG. 13D, the cylindrical portion of a wire bond 732D that is integral with the ball-shaped portion 738D can project beyond a surface 752 of the encapsulant layer 751 of the package. Alternatively, as seen in FIG. 13E, the cylindrical portion of a wire bond 732D may be fully covered by the encapsulant layer. In such case, as seen in FIG. 13E, the ball-shaped portion 738D of the wire bond 732D may in some cases be partly covered by the encapsulation layer 751.

FIG. 13F further illustrates a wire bond 732F having a core 731 of a primary metal and a metallic finish 733 thereon which includes a second metal overlying the primary metal, such as the palladium-clad copper wire or palladium-clad gold wire as described above. In another example, an oxidation protection layer of a non-metallic material such as a commercially available "organic solderability preservative" (OSP) can be formed on the unencapsulated portion of a wire bond to avoid oxidation thereof until the unencapsulated portion of the wire bond is joined to a corresponding contact of another component.

Figure 14A:
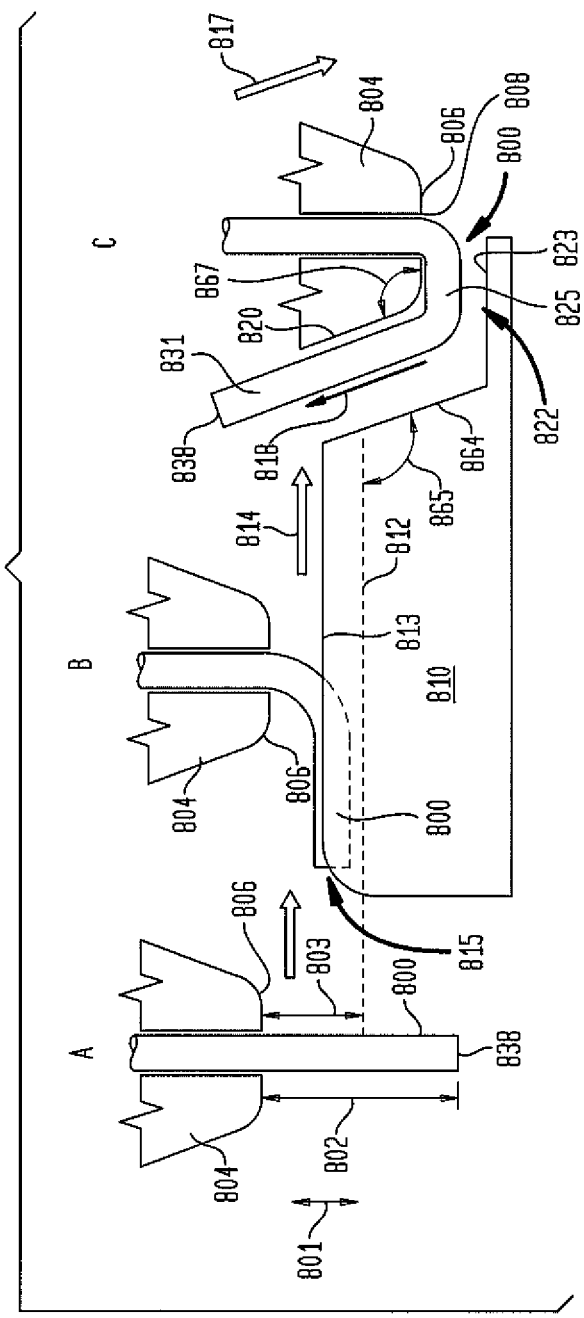
FIG. 14A illustrates stages in a method of forming a metal wire segment prior to bonding the wire segment to a conductive element according to an embodiment of the invention.

FIG. 14A illustrates a method by which a wire bond (FIG. 1) as described herein can be shaped as a wire portion extending from a face of a bonding tool 804, e.g., from a face 806 of a capillary-type bonding tool 804, prior to bonding the shaped wire portion 800 to a bonding surface, e.g., to a conductive element 28 on a substrate, as will be further described herein. As seen therein at stage A, a portion 800 of a wire, i.e., an integral portion having a predetermined length 802, of a metal wire such as a gold or copper wire or composite wire as described above described above relative to FIG. 1 extends out beyond a face 806 of a bonding tool 804. In the examples which follow, the bonding tool 804 can be a capillary having an opening in the face 806 thereof beyond which the wire portion extends. However, while the examples below refer to the bonding tool as a capillary, unless otherwise noted, the bonding tool can be either be a capillary or a different type of bonding tool, such as an ultrasonic or thermosonic bonding tool or wedge-bonding tool, for example.

In order to arrange for a predetermined length of the metal wire to extend outward beyond the capillary face 806, the initial wire length can be set by using the bonding tool 804 to bond the wire to a bonding surface in a prior stage of processing, e.g., by a stitch-bonding method or by a ribbon-bonding method. In an embodiment, when employing the ribbon-bonding method, the ribbon can be one or more flat surfaces, and can be polygonal in cross-section, such as a rectangular cross-section. Thereafter, the face 806 of the bonding tool can be moved relative to such bonding surface such that the bonding tool face 806 then is disposed at a greater height above a plane in which such bonding surface lies and the wire portion having the predetermined length extends beyond the capillary face 806. Thus, the movement of the bonding tool relative to the bonding surface can cause the wire portion 800 having the predetermined length to be drawn out of the bonding tool. Thereafter, the wire can be severed at the boundary between the stitch-bond to the bonding surface and the wire portion 800. In this way, the wire portion 800 is severed at the end 838 thereof. In one example, to sever the wire portion 800, the wire can be clamped at a location above the capillary face and the clamped wire then can be tensioned so as to cause the clamped wire to break adjacent to the bonded part of the wire and thereby free the end 838 of the wire portion 800 from the bonded second wire portion. The wire can be tensioned by exerting a force on at least one of the capillary or the bonding surface relative to the other, e.g., such as by pulling the capillary in an at least partially vertical direction relative to a direction the wire extends through the capillary. At that time, the wire portion 800 may extend in a straight direction 801 away from a face 806 of the capillary. In one example, the direction 801 may be perpendicular to the face 806 of the capillary.

In shaping the wire portion 800, the capillary and a forming surface, e.g., surface 812 within a channel or groove of a forming element 810, are positioned relative to one another such that an end 838 of the wire portion 800 that extends beyond the capillary face 806 is positioned at a greater depth 802 from the capillary face 806 than a depth 803 of the forming surface 812 below the capillary face. The forming element 810 may be one or more tools or elements which together have surfaces suitable to assist in the forming, i.e., shaping, of the wire portion prior to the wire portion being bonded to the conductive element of the substrate.

As seen at stage B, at least one of the capillary 804 or a forming surface 812 can be moved relative to one another such that the wire portion 800 moves relative to the forming surface 812 in at least a first direction 814 parallel thereto so as to bend the wire portion 800 towards the capillary 804. For example, as illustrated in FIG. 14A, movement of the capillary 804 relative to a first forming surface 812 can cause the wire portion to be bent away from an initial direction 801 as seen at stage A such that at least a part of the wire portion 800 extends along the capillary face 806. In one example, the first forming surface 812 can be a surface within a groove extending in the first direction 814 along a forming element 810, wherein the first direction can be parallel to the capillary face 806. For example, groove 815 can be open to a second surface 813 of the forming element which confronts the capillary face 806. As seen at stage B during the shaping or pre-forming process, the wire portion 800 may extend into groove and may extend in the first direction parallel to the surface 812 and parallel to a direction 814 of movement of the capillary 804 as seen at stage B of FIG. 14A.

Figure 35:
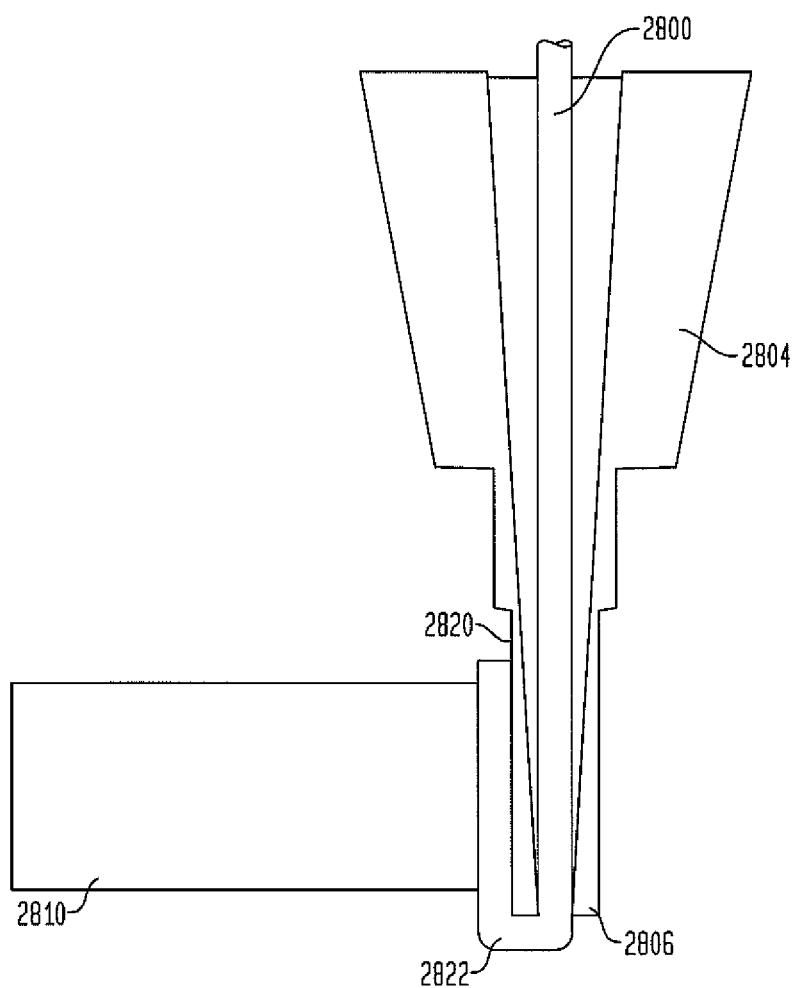
FIG. 35 shows a portion of a machine that can be used in forming various wire bond vias according in a method according to another embodiment of the present disclosure.

Thereafter, after the wire-shaping performed in stage B, in stage C the capillary 804 can be moved in a second direction 817 which is transverse to directions parallel to the capillary face 806. During this stage of processing, an exposed wall 820 of the capillary which extends away from the capillary face 806 may confront a second forming surface 864. In such way, movement of the capillary 804 in direction 817 can cause the wire portion 800 to be bent in a direction towards the exposed wall 820. In one example, the second forming surface 864 can be a surface of forming element 810, the second forming surface 864 extending away from the first forming surface 812. In one example, the second forming surface can extend at an angle 865 relative to the first forming surface 812 which may be the same as an angle 867 at which the exposed wall of the capillary extends relative to the capillary face 806. As seen at stage C of FIG. 14A, the movement of the capillary can cause a part of the wire portion 800 to project upwardly in a direction 818 along the exposed wall 820 of the capillary. Capillary or bond tool 804 may have a groove, flat side or other wire-guiding feature on exposed wall thereof to help guide wire there. The second forming surface 864 can be vertical, i.e., at an angle normal to the face of the bonding tool, when the bonding tool has a vertical wall (as shown in FIG. 35). The wire portions 800 may be formed from copper or copper alloy, and may have relatively small diameter, e.g., 25 micrometers, such that a large number of input/output connections, e.g., 1000-2000 per package.

Stage C illustrates further processing of the wire portion 800 by relative movement of the capillary 804 and a another forming surface 823 in a direction transverse to the capillary face 806, for example, in direction 817, or in a direction perpendicular to the face 806 of the capillary, the forming surface 823, or perpendicular to both surfaces. In terms of a purpose thereof, the forming surface 823 can be considered a "coining surface." When carried through to completion, such relative movement coins a part 825 of the wire portion disposed between the capillary face 806 and the coining surface 823.

Figure 14B:
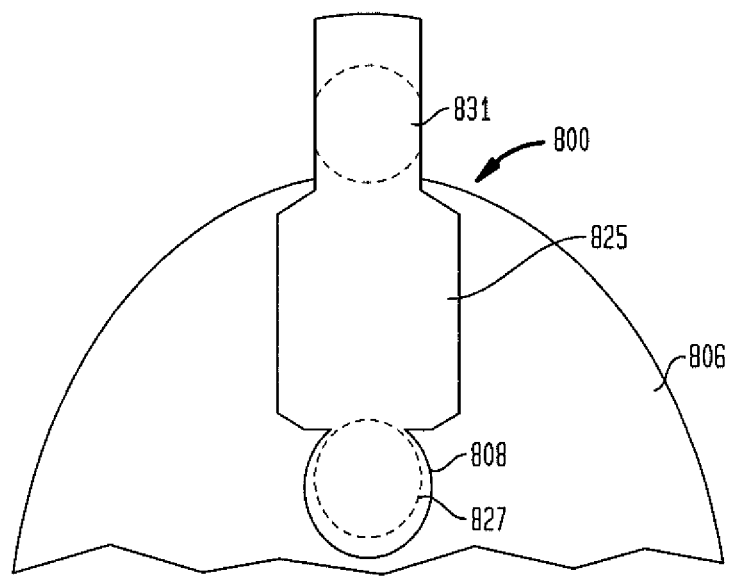
FIG. 14B is a fragmentary plan view of a shaped wire portion from a position below a capillary face.
Figure 14C:
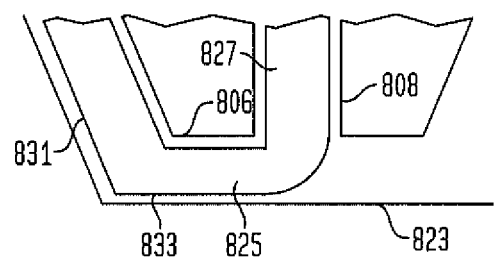
FIG. 14C is a sectional view of the shaped wire portion between the capillary face and the coining surface.

FIG. 14B is a fragmentary plan view of a shaped wire portion 800 from a position below the capillary face 806 and FIG. 14C is a sectional view further illustrating the position of the wire portion 800 between the capillary face 806 and the coining surface 823 and parts of the wire portion as will be further described below. For example, FIG. 14B illustrates the shaped wire portion from a position below the coining surface 823 and looking towards the coined part 825 of the wire portion 800 such that the capillary face 806 appears at a position above, i.e., behind the coined part 825 of the wire portion in FIG. 14B. A part 827 of the wire portion 800 aligned with the opening 808 in the capillary face is also illustrated in FIGS. 14B, 14C. A part 831 of the wire portion 800 which extends away from the capillary face 806 along the exposed wall 820 (FIG. 14A) of the capillary is also shown in FIGS. 14A-B. The parts 827 and 831 of the wire portion typically retain cylindrical cross-section after the processing described above in accordance with FIG. 14A, these parts 827, 831 of the wire possibly avoiding some of the flattening of the wire when the part 825 of the wire portion 800 is coined between the capillary face 806 and the coining surface 823.

When the coining surface 823 is flat, in one example, at least a part of a face 833 of the coined part 825 of the wire portion facing the coining surface 823 can also be flat. This flat face 833 then will be further available to be bonded by the capillary to a bonding surface of a conductive element 28 such as described above.

However, alternatively, the coining surface 823 may in some cases be patterned such that it has raised and recessed features therein. In such case, the face 833 of the coined part 825 of the wire portion may likewise be patterned face of raised and recessed features which faces away from the capillary face 806. Such patterned face of the coined part 825 would then be available to be bonded to a bonding surface of a conductive element 28.

After pre-shaping the wire portion 800 in this manner, the capillary can be used to bond the pre-shaped wire portion 800 to a bonding surface of a conductive element 28 of a substrate (FIG. 1). To form the wire bond, the wire is now moved away from the forming unit 810 and moved towards the conductive element 28 (FIG. 1) of the substrate where the capillary then stitch bonds the coined wire portion 825 to the conductive element 28, with the end 838 of the wire portion being the remote end 38 (FIG. 1) of the wire bond remote from the conductive element 28.

The provision of a wire portion 800 having a coined part 825 with a lower surface 833 which can be flat, or alternatively, patterned, or a face that is partly flat and partly patterned, can assist in forming a good bond between the shaped wire portion 800 and the bonding surface of the conductive element 28. As can be understood from FIG. 14A, when ready for bonding to the bonding surface, the shaped wire portion 800 is rather long relative to the diameter of the wire, and a long extension of the wire, being much if not most of the shaped wire portion is unsupported except by the bonding surface of the conductive element 28 (FIG. 1) when the wire portion is being bonded thereto.

Figure 15:
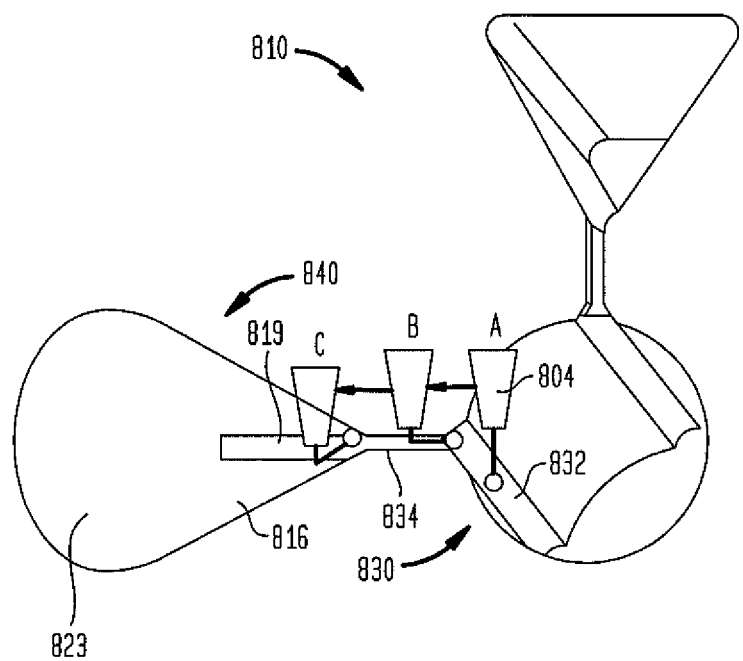
FIG. 15 further illustrates a method as depicted in FIG. 14 and a forming unit suitable for use in such method.

With the coining of the wire portion, the stability of the wire portion can be improved when the wire portion is being bonded to the bonding surface. For example, the flattening or patterning of the coined part 825 of the wire may help increase friction between the lower surface 833 of the coined part 825 and the bonding surface when the capillary applies force to the wire portion to bond it to the bonding surface, and may decrease a tendency of the wire to pivot, roll or otherwise move when the bonding force is applied. In this, way, the coined part 825 of the wire portion can overcome a possibility that the wire having the original cylindrical shape would pivot or roll when force is applied by the face 806 of a capillary to bond the wire to the bonding surface. FIG. 15 further illustrates an example of movement of the capillary over surfaces of a forming element 810 in a method according to an embodiment of the invention. As seen therein, in a particular example, the forming element 810 may have a first opening or depression 830 in which the capillary 804 is disposed at an initial stage (FIG. 14A, stage A) of wire-shaping, when the wire portion 800 extends outwardly beyond an opening 808 of the capillary. The opening 830 or depression may include a tapered portion, channel or groove 832 which can help guide the wire portion 800 onto a surface 812 at stage B, and which may also guide the wire portion a particular portion of the surface 812. Such tapered portion can be tapered in such way that the tapered portion grows smaller in a direction towards the surface 812 to help engage and guide the wire portion to a particular location.

The forming unit may further include a channel 834 or groove for guiding the segment 800 in stage B of the process. As further shown in FIG. 15, the forming unit may include a further opening or depression or 840 in which an interior surface 816 thereof may function as the second forming surface along which the capillary moves in stage C of the process to cause the metal wire segment to be bent in direction 818 against the exterior wall 820 of the capillary. In one example, the second forming surface within the opening 816 or depression can include a channel or groove 819 which is recessed relative to another interior surface within the opening 816. In a particular example, the coining surface 823 can be disposed within the opening 816. Optionally, a groove may be formed on the tool or on the capillary itself, in addition to or as an alternative to groove 819. For example, as shown in FIG. 14C, a groove 811 may be formed on the capillary face 806 in addition to or as an alternative to groove 819.

In an embodiment, a variation of the capillary shown in FIG. 14 can be used that incorporates a vertical or near-vertical side wall 2820. As shown in FIG. 35, the side wall 2820 of capillary 2804 can be substantially vertical or, in other words, parallel to the wire segment 2800 or perpendicular to the face 2806 of the capillary 2804. This can allow for formation of a wire bond (32 in FIG. 1) that is closer to vertical, i.e., closer to an angle of 90° away from the surface of the first surface of the substrate, than achieved by a side wall at an exterior of the capillary that defines an angle having a measure substantially less than 90°, such as the capillary shown in FIG. 14. For example, using a forming tool 2810, a wire bond can be achieved that is disposed at an angle from the first portion which extends between 25° and 90°, or between about 45° and 90° or between about 80° and 90° with respect to the first wire portion 2822.

In another variation, a capillary 3804 can include a surface 3808 that projects beyond the face 3806 thereof. This surface 3808 can be included, for example over the edge of the side wall 3820, and may form a lip. In the method for forming a wire bond (32 in FIG. 1, for example), the capillary 3804 can be pressed against the first portion 3822 of the wire segment 3800 during forming of wire segment, e.g., when the capillary moves in a direction along a forming surface 3816 which extends in a direction away from surface 3812. In this example, surface 3808 presses into the first portion 3822 at a location near the bend from which the remaining wire segment 3800 extends. This can cause deformation of the wire segment 3800 such that it may press against the wall 3820 of the capillary 3804 and move to a somewhat more vertical position once the capillary 3804 is removed. In other instances, the deformation from the surface 3808 can be such that a position of the wire segment 3800 can be substantially retained when the capillary 3804 is removed.

Figure 16E:
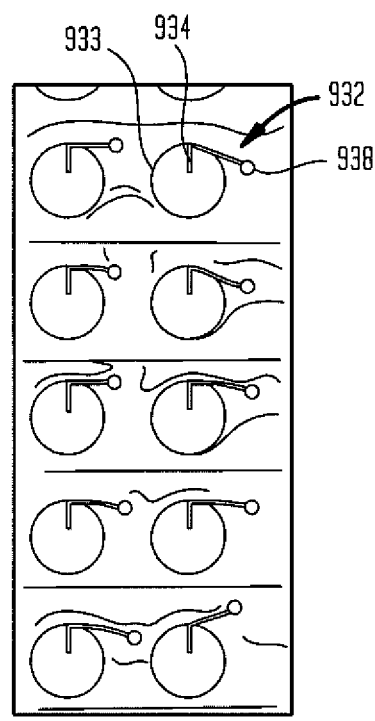
FIG. 16E is a top elevation view illustrating wire bonds formed according to an embodiment of the invention.
Figure 16A:
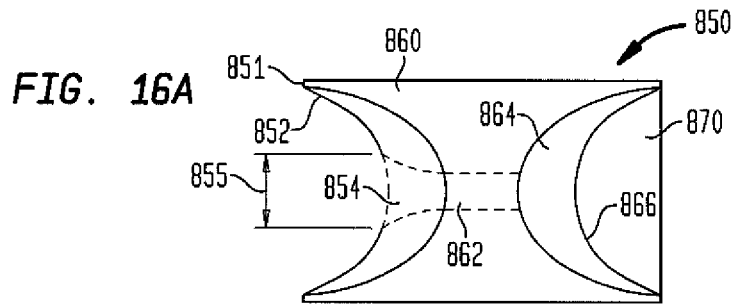
FIGS. 16A-16D are plan views illustrating movement of a bond tool relative to a forming element during shaping of a wire portion in accordance with an embodiment of the invention.
Figure 16B:
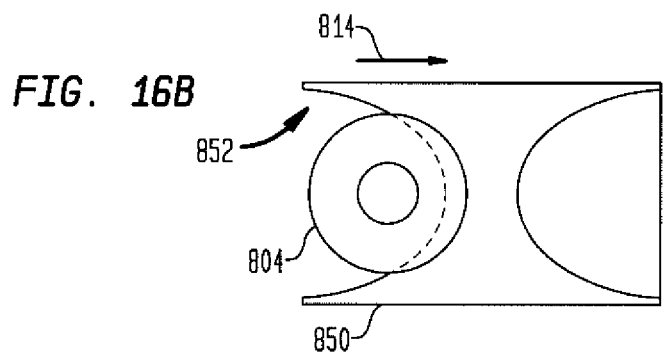
Figure 16C:
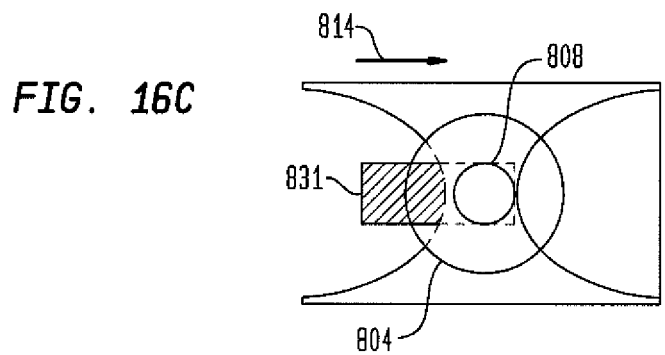

FIGS. 16A-16C illustrate stages of shaping a wire and a set of forming surfaces used therein in a method of forming wire bonds according to an embodiment of the invention. FIG. 16A shows a forming element 850 which can be used in shaping a portion of a wire extending beyond a face of a bonding tool prior to forming a bond between the wire portion and a bonding surface of a substrate. As in the above-described example (FIGS. 14A-C), the bonding tool can be a capillary type tool or other bonding tool such as an ultrasonic bonding tool or wedge-bonding tool. As seen in FIG. 16A, a recess 852 may extend in an inward direction from an edge 851 of the forming element 850. The recess 852 can be configured to receive a portion of a wire extending from a face of a bonding tool, such as a wire portion extending from a face of the capillary or other type bonding tool. In a particular embodiment, the recess may additionally include a tapered portion or channel 854 having width 855 somewhat larger than the diameter of a wire to be shaped therein. As a tapered portion, the width can become smaller in a direction towards the first forming surface 860 such that the tapered portion can help guide the wire towards a particular area 862, e.g., a central area, of the first forming surface. The first forming surface may be a flat, i.e., planar or substantially planar surface which extends in first and second transverse directions, and area 862 of the first forming surface can likewise be flat. In such way, the first forming surface can extend in directions parallel to a face of the bonding tool or capillary when shaping the wire portion in stage of the method such as seen in stage B as seen in FIG. 14.

The forming element 850 typically also includes a second forming surface 864 which extends away from the first forming surface 860. In the example seen in FIG. 16A, the second forming surface 864 extends away from the first forming surface 860. The second forming surface 864 may be disposed in a second recess 866 extending inwardly from an edge 861 of the forming element opposite edge 851. In one example, an angle 865 at which the second forming surface 864 slopes away from the first forming surface 860 can be the same as an angle 867 at which an exposed wall 868 of the bonding tool slopes away from the face of the bonding tool, as seen in FIG. 14A.

The forming element 860 typically has an additional surface, which can be a "coining" surface 870 against which a face of the bonding tool or capillary can be pressed during the wire-shaping process to coin a part of the wire that is disposed between the face 806 of the bonding tool and the coining surface 870.

FIG. 16B illustrates a stage of shaping the wire portion 800 (FIG. 14A) when the capillary or other type bonding tool 804 has moved into a position in which the shaping of the wire portion extending beyond the bonding tool face is about to begin. At such time, the wire portion 800 extends into the recess 852 of the forming element 850. FIG. 16B illustrates a stage of shaping the wire analogous to stage A shown in FIG. 14A, which further shows the direction 814 of movement of the bonding tool along the forming element 850.

FIG. 16C illustrates a further stage of shaping the wire portion 800 (FIG. 14A) when the bonding tool 804 has moved in direction 814 along a first forming surface 860 or 862, these surfaces having been described above relative to FIG. 16A. A part 831 of the wire portion is shown extending away from an opening 808 of the bonding tool similar to the wire portion seen at stage B in FIG. 14A.

Figure 16D:
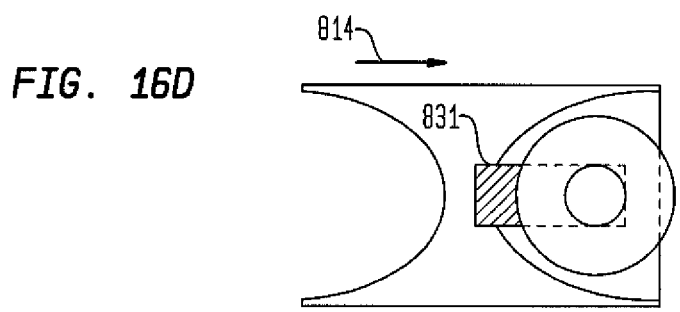

FIG. 16D further illustrates a stage of shaping the wire analogous to that seen at stage C of FIG. 14A in which the bonding tool 804 has moved to a position aligned with a second recess in the forming element. At this time, the part 831 of the wire portion which extends away from the opening can be bent towards the exposed wall of the bonding tool, as shown and described above with respect to FIG. 14A. In addition, at this time, as shown and described above regarding stage C of FIG. 14A, the bonding tool 804 can coin the wire portion by pressing a part of the wire portion between the face of the bonding tool and the coining surface, the coining surface 870 being as shown in FIG. 16A. FIG. 16E is a diagrammatic view showing that wire bonds 932 formed according to one or more of the methods described herein can have ends 938 which are offset from their respective bases 934. In one example, an end 938 of a wire bond can be displaced from its respective base such that the end 938 is displaced in a direction parallel to the surface of the substrate beyond a periphery of the conductive element to which it is connected. In another example, an end 938 of a wire bond can be displaced from its respective base 934 such that the end 938 is displaced in a direction parallel to the surface of the substrate beyond a periphery 933 of the conductive element to which it is connected.

Figure 17A:
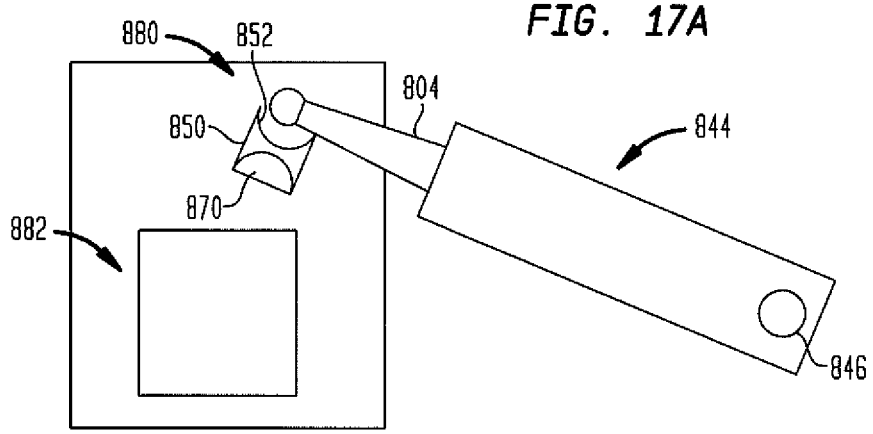
FIGS. 17A, 17B and 17C are views from above a wirebonding assembly, further illustrating a process of shaping a wire portion and bonding the shaped wire portion according to an embodiment of the invention.
Figure 17B:
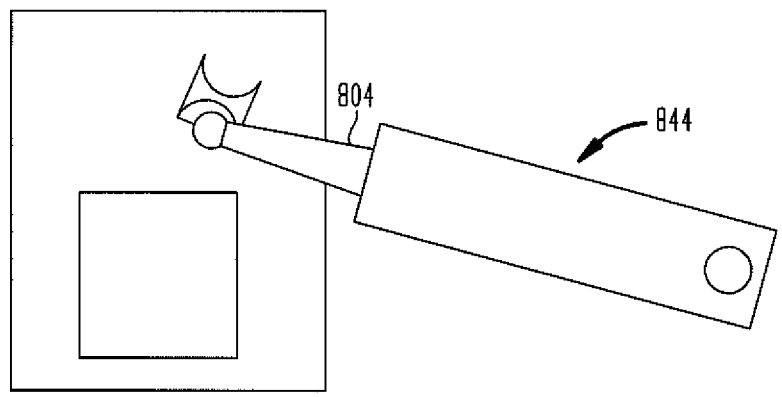
Figure 17C:
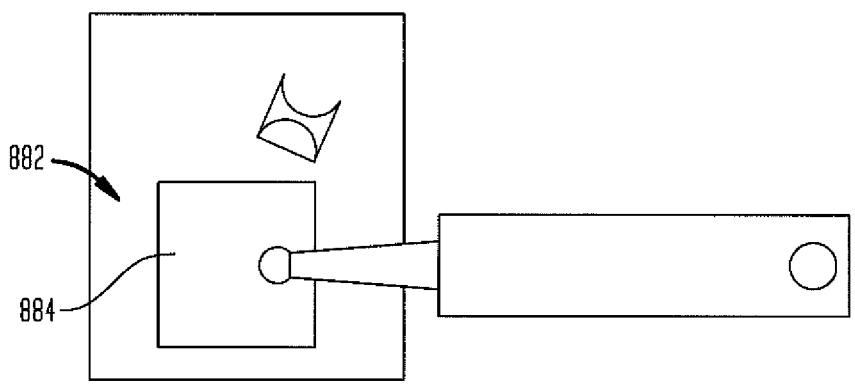

FIGS. 17A-C illustrate an example of using a bonding tool to shape the wire portion at a forming station 880. The forming station can be assembled with, e.g., mounted to a structure to which a wirebonding station is also assembled, so that a wire portion, after being shaped at the forming station by the bonding tool, can then be moved by the bonding tool to the wirebonding station and then bonded to a bonding surface on a substrate, microelectronic element or other component. As seen in FIG. 17A, a bond tool 804 portion of a bond head 844 can first be moved to the forming station 880 where the wire portion can be shaped by movement of the bond tool as described above. For example, the bond head 844 or a portion of the bond head can pivot about an axis to move the bonding tool to the forming station 880.

The forming element 850 can be oriented in a specific way relative to the wirebonding station to reduce the extent of movement required by the bond head or bond tool between the forming station and wirebonding station. As seen in FIG. 17A, in one example, the forming element 850 at the forming station can be oriented such that the recess 852 described above relative to FIG. 16A may be at a remote position relative to the wirebonding station and the coining surface 870 may be at a position closer to, i.e., adjacent to the wirebonding station. In another example, the recess 852 and the coining surface 870 can be oriented in the opposite way with the recess 852 closer to the wirebonding station than the coining surface. In yet another example, it may be possible for the forming element to be in one orientation during the shaping of the wire portion, and then the orientation of the forming element can be reversed to permit greater freedom of movement of the bond tool with the shaped wire portion thereon prior to moving the shaped wire portion into final position for bonding.

FIG. 17B illustrates a position of the bond tool 804 and bond head 844 at the completion of shaping the wire portion, which may include coining the wire portion as described above. At such time, the bond tool can then be moved from the position at the forming station 880 (FIG. 17B) into position (FIG. 17C) at the wirebonding station 882 where the shaped wire portion then is bonded to a bonding surface on a component 884.

Figure 18A:
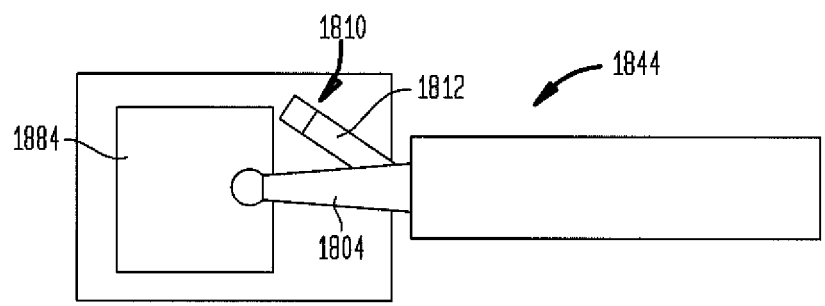
FIGS. 18A, 18B and 18C are views from above a wirebonding assembly, further illustrating a process of shaping a wire portion and bonding the shaped wire portion according to an embodiment of the invention.
Figure 18B:
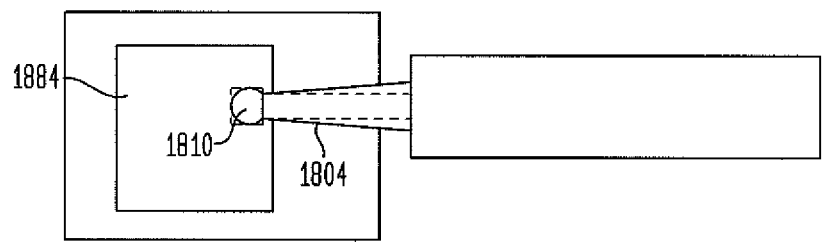
Figure 18C:
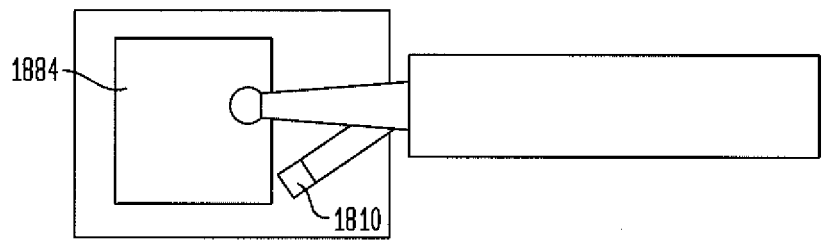

FIGS. 18A-18C illustrate another variation in which the bond tool 1804 and a forming element 1810, such as the forming element 810 or 850 as described above, can be assembled with a common bond head 1844. In one example, the forming element 1810 can be affixed to or otherwise carried on the bond head 1844 such that movement of the bond head transports the forming element 1810 attached thereto as well as the bonding tool. However, the forming element 1810 can move relative to the bonding tool so as to assist in the shaping of the wire portion prior to bonding of the wire portion, but then the forming element 1810 can be moved away from such forming position once the wire has been shaped and is ready to be bonded to a component 1884 as seen in FIG. 18C.

In one example, the forming element 1810 can be carried on a pivotable or otherwise movable arm 1812, for relative movement between the bonding tool 1804 and the arm 1812. Alternatively, the forming element 1810 may be provided on an arm having a fixed position during operation, and the bonding tool instead can move relative to the forming element. In an example of operation, at a stage of processing shown in FIG. 18A, the bonding tool 1804 and the forming element 1810 can be arranged in a position as shown in FIG. 18A in which the forming element 1810 and the bonding tool are at spaced apart positions. When so arranged as in FIG. 18A, a shaped wire portion can be bonded to a bonding surface of a conductive element or other feature on component 1884.

Thereafter, as seen in FIG. 18B, relative motion between the forming element and the bonding tool places the bonding tool and the forming element at positions in which the wire portion can be shaped such as described above relative to one or more of FIGS. 14-16. Thus, in a particular example, during the shaping of the wire portion, the bonding tool can remain at a position above or in close proximity to a component 1884 to be wire bonded, which may be above or in close proximity to a particular bond site on the component 1884. In that way, the movement of the bond head can be reduced, and thereby it may be possible to reduce an amount of time needed to shape the wire portion prior to bonding the wire portion to the bonding surface on the component. As further seen in FIG. 18C, after the wire portion has been shaped, the forming element 1810 may move to a third position as seen in FIG. 18C, and while the forming element is in such position, the bonding tool may then bond the shaped wire portion to the component.

FIG. 19 illustrates a variation of the above-described preforming process which can be used to form wire bonds 332Cii (FIG. 5) having a bend and which have ends 1038 displaced in a lateral direction 1014A from the portions 1022 which will be stitch-bonded to the conductive elements as bases 1034 of the wire bonds.

As seen in FIG. 19, the first three stages A, B, and C of the process can be the same as described above with reference to FIG. 14A. Then, referring to stages C and D therein, a portion 1022A of the wire bond adjacent the face 806 of the capillary 804 is clamped by a tool which can be integrated with the forming unit. The clamping may be performed actively or passively as a result of the motion of the capillary over the forming unit. In one example, the clamping can be performed by pressing a plate having a non-slip surface thereon onto the metal wire segment 800 to preclude movement of the metal wire segment.

While the metal wire segment 800 is clamped in this manner, at stage D shown in FIG. 19, the capillary or bond tool 804 moves in a direction 1016 along a third surface 1018 of the forming unit 1010 and feeds out a length of wire equivalent to the distance moved along surface 1018. Thereafter, at stage E, the capillary is moved downwardly along a third surface 1024 of the forming unit to cause a portion of the wire to be bent upwardly along an exterior surface 1020 of the capillary 804. In such way, an upwardly projecting portion 1026 of the wire can be connected to another upwardly projecting portion 1036 by a third portion 1048 of the metal wire.

After formation of the wire segment and bonding thereof to a conductive element to form a wire bond, particularly of the ball bond type discussed above, the wire bond (32 in FIG. 1, for example) is then separated from a remaining portion of the wire within the capillary (such as 804 in FIG. 14A). This can be done at any location remote from the base 34 of the wire bond 32 and is preferably done at a location remote from the base 34 by a distance at least sufficient to define the desired height of the wire bond 32. Such separation can be carried out by a mechanism disposed within the capillary 804 or disposed outside of the capillary 804, between the face 806 and the base 34 of the wire bond 32. In one method, the wire segment 800 can be separated by effectively burning through the wire 800 at the desired separation point, which can be done by application of a spark or flame thereto. To achieve greater accuracy in wire bond height, different forms of cutting the wire segment 800 can be implemented. As described herein, cutting can be used to describe a partial cut that can weaken the wire at a desired location or cutting completely through the wire for total separation of the wire bond 32 from the remaining wire segment 800.

Figure 32A:
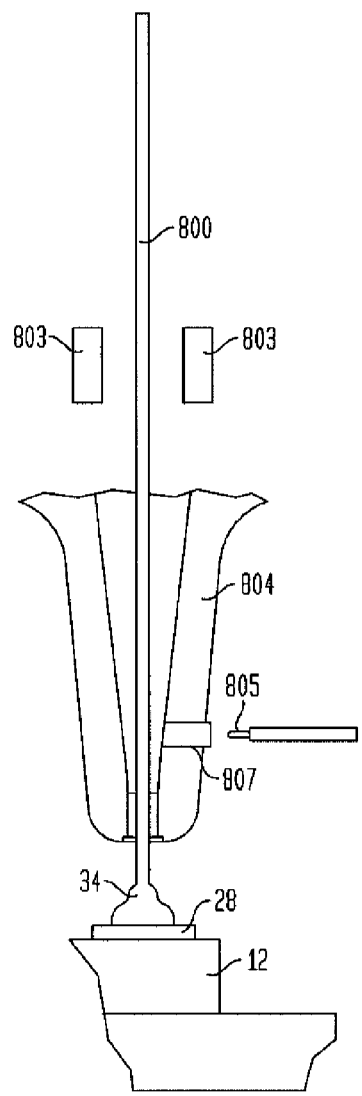
FIGS. 32A and 32B show a portion of a machine that can be used in forming various wire bond vias in various stages of a method according to another embodiment of the present disclosure.
Figure 32B:
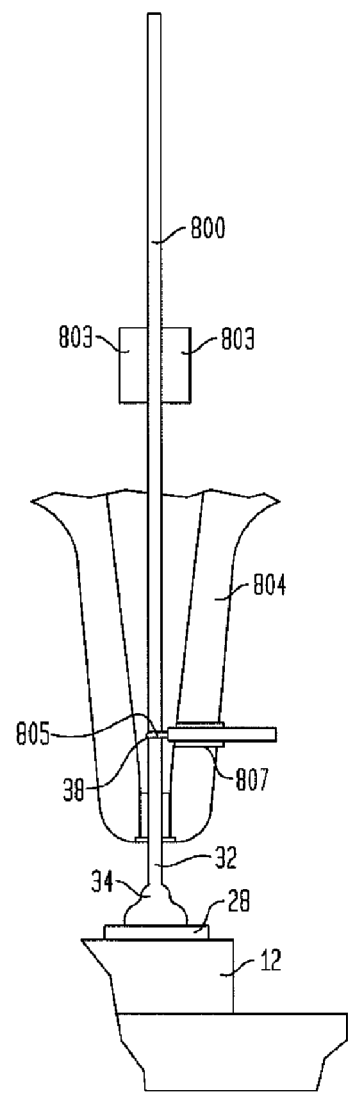

In one example shown in FIG. 32 a cutting blade 805 can be integrated into the bond head assembly, such as within capillary 804. As shown, an opening 807 can be included in the side wall 820 of the capillary 804 through which cutting blade 805 can extend. The cutting blade 805 can be moveable in and out of the interior of the capillary 804 so that it can alternately allow the wire 800 to freely pass therethrough or engage the wire 800. Accordingly, the wire 800 can be drawn out and the wire bond 32 formed and bonded to a conductive element 28 with the cutting blade 805 in a position outside of the capillary interior. After bond formation, the wire segment 800 can be clamped using a clamp 803 integrated in the bond head assembly to secure the position of the wire. The cutting blade 803 can then be moved into the wire segment to either fully cut the wire or to partially cut or weaken the wire. A full cut can form end surface 38 of the wire bond 32 at which point the capillary 804 can be moved away from the wire bond 32 to, for example, form another wire bond. Similarly, if the wire segment 800 is weakened by the cutting blade 805, movement of the bond head unit with the wire still held by the wire clamp 803 can cause separation by breaking the wire 800 at the area weakened by the partial cut.

The movement of the cutting blade 805 can be actuated by pneumatics or by a servo motor using an offset cam. In other examples the cutting blade 805 movement can be actuated by a spring or a diaphragm. The triggering signal for the cutting blade 805 actuation can be based on a time delay that counts down from formation of the ball bond or can be actuated by movement of the capillary 804 to a predetermined height above the wire bond base 34. Such a signal can be linked to other software that operates the bonding machine so that the cutting blade 805 position can be reset prior to any subsequent bond formation. The cutting mechanism can also include a second blade (not shown) at a location juxtaposed with blade 805 with the wire therebetween, so as to cut the wire by movement of one or more of the first and second blades relative to the other of the first and second blades, such as in one example, from opposite sides of the wire.

Figure 33:
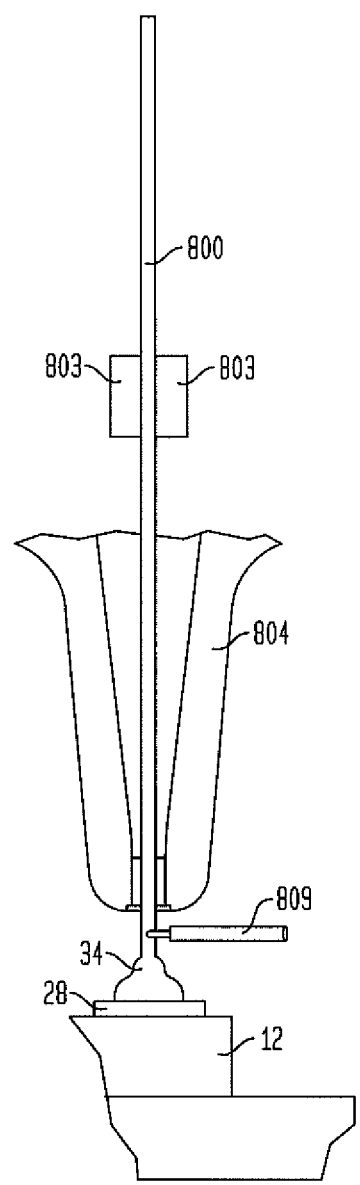
FIG. 33 shows a portion of a machine that can be used in forming various wire bond vias according in a method according to another embodiment of the present disclosure.

In another example, a laser 809 can be assembled with the bond head unit and positioned to cut the wire. As shown in FIG. 33, a laser head 809 can be positioned outside of capillary 804 such as by mounting thereto or to another point on the bond head unit that includes capillary 804. The laser can be actuated at a desired time, such as those discussed above with respect to the cutting blade 805 in FIG. 32, to cut the wire 800, forming end surface 38 of the wire bond 32 at a desired height above the base 34. In other implementations, the laser 809 can be positioned to direct the cutting beam through or into the capillary 804 itself and can be internal to the bond head unit. In an example, a carbon dioxide laser can be used or, as an alternative, a Nd:YAG or a Cu vapor laser could be used.

Figure 34A:
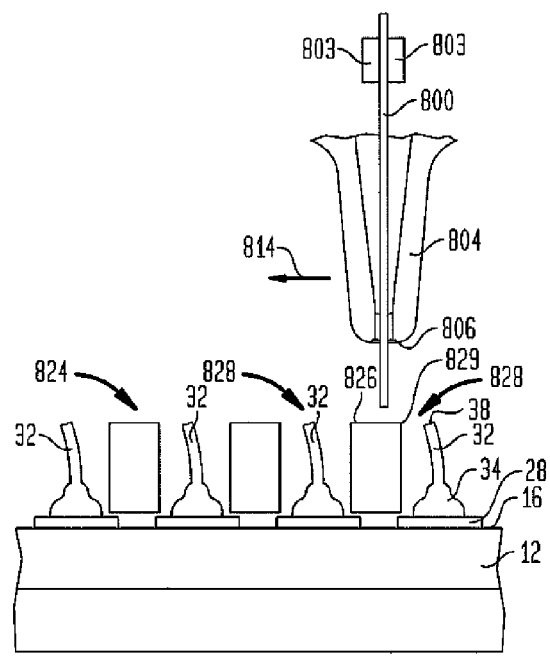
FIGS. 34A-C show various forms of an instrument that can be used in a method for making wire bonds according to an embodiment of the present disclosure.
Figure 34B:
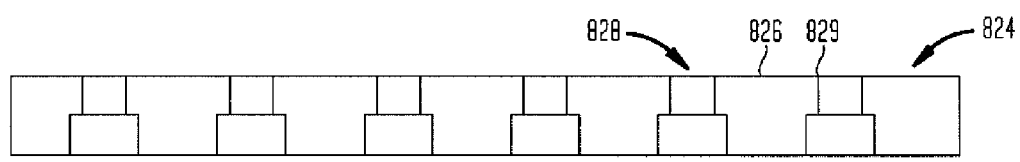
Figure 34C:
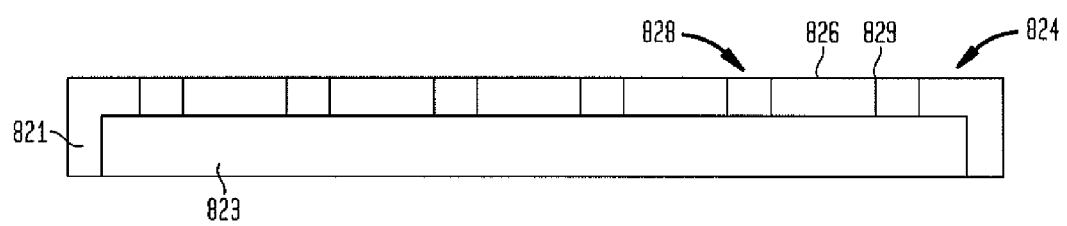

In another embodiment a stencil unit 824 as shown in FIGS. 34A-C can be used to separate the wire bonds 32 from the remaining wire segment 800. As shown in FIG. 34A, the stencil 824 can be a structure having a body that defines an upper surface 826 at or near the desired height of the wire bonds 32. The stencil 824 can be configured to contact the conductive elements 28 or any portions of the substrate 12 or package structure connected thereto between the conductive elements 28. The stencil includes a plurality of holes 828 that can correspond to the desired locations for the wire bonds 32, such as over conductive elements 28. The holes 828 can be sized to accept the capillary 804 of the bond head unit therein so that the capillary can extend into the hole to a position relative to the conductive element 28 to bond the wire 800 to the conductive element, 28 to form the base 34, such as by ball bonding or the like. In one example, the stencil can have holes through which individual ones of the conductive elements are exposed. In another example, a plurality of the conductive elements can be exposed by a single hole of the stencil. For example, a hole can be a channel-shaped opening or recess in the stencil through which a row or column of the conductive elements are exposed at a top surface 826 of the stencil.

The capillary 804 can then be moved vertically out of the hole 828 while drawing out the wire segment to a desired length. Once cleared from the hole 828, the wire segment can be clamped within the bond head unit, such as by clamp 803, and the capillary 804 can be moved in a lateral direction (such as parallel to the surface 826 of stencil 824) to move the wire segment 800 into contact with an edge 829 of the stencil 824 defined by the intersection of the surface of the hole 828 and the outside surface 826 of the stencil 824. Such movement can cause separation of the wire bond 32 from a remaining portion of the wire segment 800 that is still held within the capillary 804. This process can be repeated to form the desired number of wire bonds 32 in the desired locations. In an implementation, the capillary can be moved vertically prior to wire separation such that the remaining wire segment projects beyond the face 806 of the capillary 804 by a distance 802 sufficient to form a subsequent ball bond. FIG. 34B shows a variation of stencil 824 in which the holes 828 can be tapered such that they have a diameter that increases from a first diameter at surface 826 to a greater diameter away from surface 826. In another variation, as shown in FIG. 34C, the stencil can be formed having an outer frame 821 having a thickness sufficient to space apart surface 826 at the desired distance from substrate 12. Frame 821 can at least partially surround a cavity 823 configured to be positioned adjacent substrate 12 with a thickness of the stencil 824 extending between the surface 826 and the open area 823 such that the portion of stencil 824 that includes the holes 828 is spaced apart from the substrate 12 when positioned thereon.

FIGS. 20A-C illustrate one technique that can be used when forming the encapsulation layer by molding in order that unencapsulated portions 39 (FIG. 1) of the wire bonds project beyond a surface 44 of the encapsulation layer 42. Thus, as seen in FIG. 20A, a film-assisted molding technique can be used by which a temporary film 1102 is placed between a plate 1110 of a mold and a cavity 1112 in which a subassembly including the substrate, wire bonds 1132 joined thereto, and a component such as a microelectronic element may be joined. The film 1102 may be formed from ethylene tetrafluroethylene. The film 1102 may cover at least 10% of the length of the wire bonds and may be at least 50 micrometers. In one embodiment, the film 1102 may be 200 micrometers, although the film can be thicker or thinner than 200 micrometers. FIG. 20A further shows a second plate 1111 of the mold which can be disposed opposite the first plate 1110.

Then, as seen in FIGS. 20B-20C, when the mold plates 1110, 1111 are brought together, the ends 1138 of wire bonds 1132 can project into the temporary film 1102. When a mold compound is flowed in the cavity 1112 to form encapsulation layer 1142, the mold compound does not contact the ends 1138 of the wire bonds because they are covered by the temporary film 1102. After this step, the mold plates 1110, 1111 are removed from the encapsulation layer 1142, the temporary film 1102 can now be removed from the mold surface 1144, which then leaves the ends 1138 of the wire bonds 1132 projecting beyond the surface 1144 of the encapsulation layer.

The film-assisted molding technique may be well adapted for mass production. For example, in one example of the process, a portion of a continuous sheet of the temporary film can be applied to the mold plate. Then the encapsulation layer can be formed in a cavity 1112 that is at least partially defined by the mold plate. Then, a current portion of the temporary film 1102 on the mold plate 1110 can be replaced by automated means with another portion of the continuous sheet of the temporary film. In a variation of the film-assisted molding technique, instead of using a removable film as described above, a water-soluble film can be placed on an inner surface of the mold plate 1110 prior to forming the encapsulation layer. When the mold plates are removed, the water soluble film can be removed by washing it away so as to leave the ends of the wire bonds projecting beyond the surface 1144 of the encapsulation layer as described above.

Figure 37A:
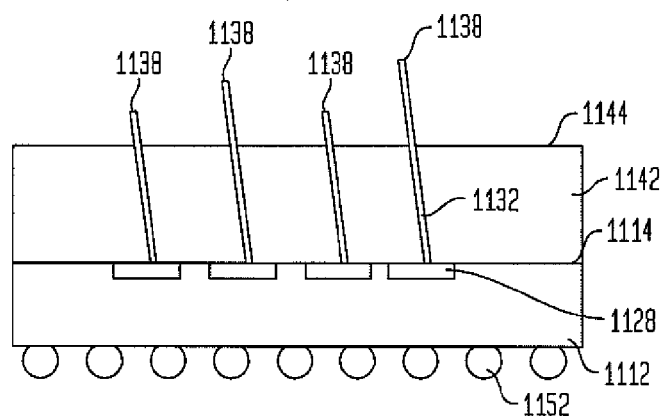
FIGS. 37 A-D show sectional views illustrating stages of fabricating a microelectronic package according to an embodiment of the present disclosure.
Figure 37B:
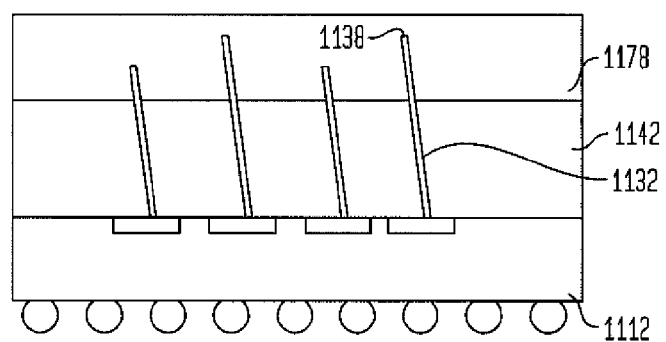
Figure 37C:
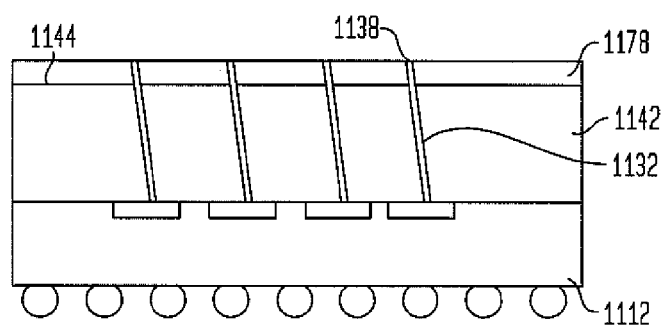
Figure 37D:
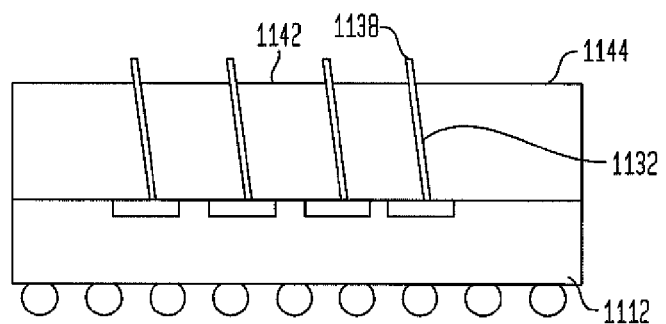

In an example of the method of FIGS. 20A-B, the heights of the wire bonds 1132 above the surface 1144 of encapsulation layer 1142 can vary among the wire bonds 1132, as shown in FIG. 37A. A method for further processing the package 1110 such that the wire bonds 1132 project above surface 1142 by substantially uniform heights is shown in FIGS. 37B-D and utilizes a sacrificial material layer 1178 that can be formed to cover the unencapsulated portions of the wire bonds 1132 by application thereof over surface 1144. The sacrificial layer 1178 can then be planarized to reduce the height thereof to the desired height for wire bonds 1132, which can be done by lapping, grinding, or polishing or the like. As also illustrated in the Figures, the planarization of the sacrificial layer 1178 can begin by reducing the height thereof to a point where the wire bonds 1132 become exposed at the surface of the sacrificial layer 1178. The planarization process can then also planarize the wire bonds 1132 simultaneously with the sacrificial layer 1178 such that, as the height of the sacrificial layer 1178 is continued to be reduced, the heights of the wire bonds 1132 are also reduced. The planarization can be stopped once the desired height for the wire bonds 1132 is reached. It is noted that in such a process the wire bonds 1132 can be initially formed such that their heights, while being non-uniform, are all greater than the targeted uniform height. After planarization reduces the wire bonds 1132 to the desired height, the sacrificial layer 1178 can be removed such as by etching or the like. The sacrificial layer 1178 can be formed from a material that can allow for removal by etching using an etchant that will not significantly affect the encapsulant material. In one example, the sacrificial layer 1178 can be made from a water soluble plastic material.

Figure 21A:
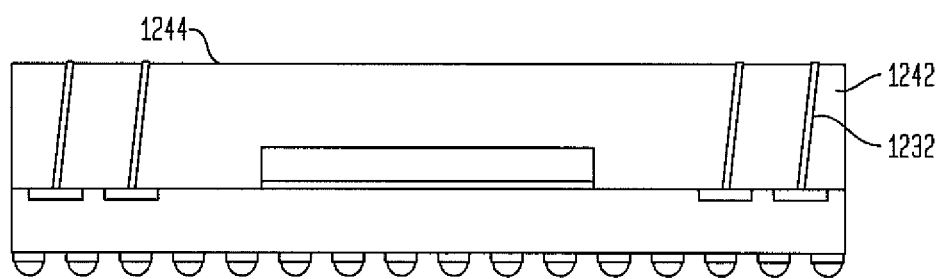
FIG. 21A is a sectional view illustrating a stage of fabricating an encapsulation layer of a microelectronic package according to an embodiment of the invention.
Figure 21B:
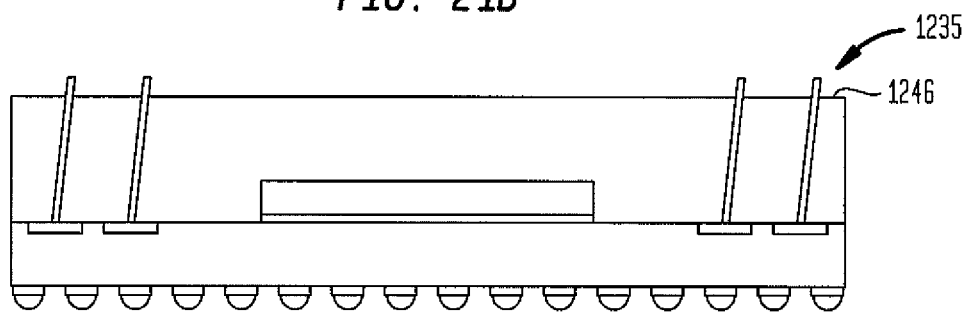
FIG. 21B is a sectional view illustrating a stage of fabricating an encapsulation layer of a microelectronic package subsequent to the stage shown in FIG. 21A.

FIGS. 21A and 21B illustrate another method by which unencapsulated portions of the wire bonds can be formed which project beyond a surface of the encapsulation layer. Thus, in the example seen in FIG. 21A, initially wire bonds 1232 may be flush with or may not even be exposed at a surface 1244 of the encapsulation layer 1242. Then, as shown in FIG. 21B, a portion of the encapsulation layer, e.g., a molded encapsulation layer, can be removed to cause the ends 1238 to project beyond the modified encapsulation layer surface 1246. Thus, in one example, laser ablation can be used to recess the encapsulation layer uniformly to form a planar recessed surface 1246. Alternatively, laser ablation can be performed selectively in areas of the encapsulation layer adjoining individual wire bonds.

Among other techniques that can be used to remove at least portions of the encapsulation layer selectively to the wire bonds include "wet blasting" techniques. In wet blasting, a stream of abrasive particles carried by a liquid medium is directed towards a target to remove material from the surface of the target. The stream of particles may sometimes be combined with a chemical etchant which may facilitate or accelerate the removal of material selectively to other structure such as the wire bonds which are to remain after wet blasting.

Figure 38A:
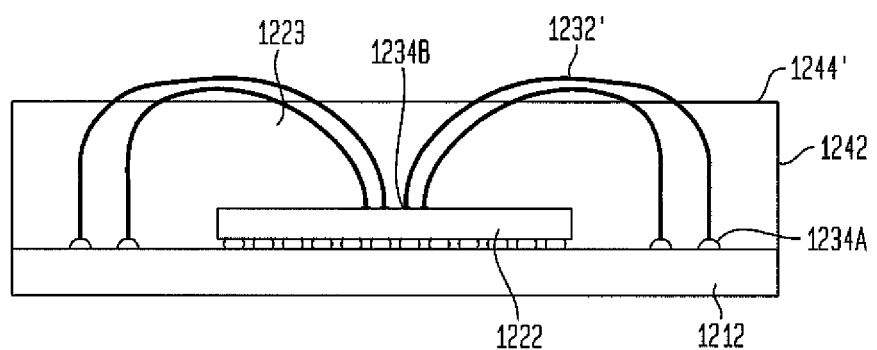
FIGS. 38A and 38B show sectional views illustrating stages of fabricating a microelectronic package according to another embodiment of the present disclosure.
Figure 38B:
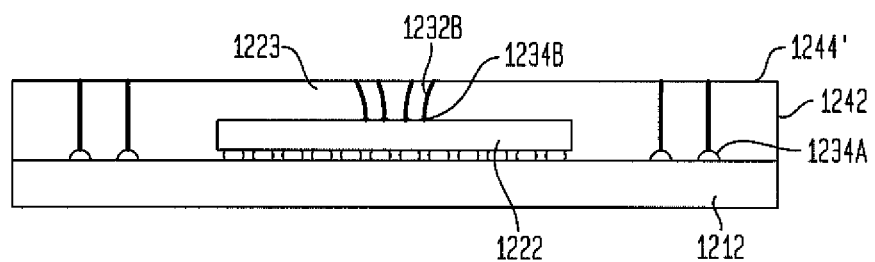

In the example shown in FIGS. 38A and 38B, in a variation of the method shown in FIGS. 21A and 21B, wire bond loops 1232' can be formed that have bases 1234a on conductive elements 1228 at one end and are attached to a surface of the microelectronic element 1222 at the other end 1234b. For attachment of the wire bond loops 1232' to the microelectronic element 1222, the surface of the microelectronic element 1223 can be metalized such as by sputtering, chemical vapor deposition, plating or the like. The bases 1234a can be ball bonded, as shown, or edge bonded, as can the ends 1232b joined to the microelectronic element 1222. As further shown in FIG. 38A, the dielectric encapsulation layer 1242 can be formed over substrate 1212 to cover the wire bond loops 1232'. The encapsulation layer 1242 can then be planarized, such as by grinding, lapping, polishing, or the like, to reduce the height thereof and to separate the wire bond loops 1232' into connection wire bonds 1232A that are available for joining to at least the end surfaces 1238 thereof for electrical connection to the conductive elements 1228 and thermal dissipation bonds 1232B that are joined to the microelectronic element 1222. The thermal dissipation bonds can be such that they are not electrically connected to any of the circuitry of the microelectronic element 1222 but are positioned to thermally conduct heat away from the microelectronic element 1222 to the surface 1244 of the encapsulation layer 1242. Additional processing methods can be applied to the resulting package 1210', as described elsewhere herein.

Figure 22A:
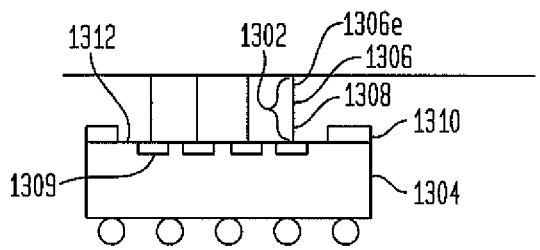
FIGS. 22A-22E illustrate yet another method of forming an encapsulation layer by molding in which unencapsulated portions of wire bonds protrude through the encapsulation layer.

FIGS. 22A-22E illustrate yet another method of forming an encapsulation layer by molding in which unencapsulated portions of wire bonds protrude through the encapsulation layer. As shown in FIG. 22A, wire bonds 1302 are molded onto a substrate 1304. The wire bonds 1302 may include a wire 1306 and a base 1308, which may be connected to a conductive element, such as an electroless nickel electroless palladium immersion gold (ENEPIG) material. The wire 1306 may be formed from a material including copper or a copper alloy. A raised material region 1310, such as a dam, may be formed at or on a face 1312 of the substrate 1304, for example, along the perimeter of the face 1312 of the semiconductor region with the wire bonds 1302 positioned within an area circumscribed or at least partially bordered by the region 1310. In a particular example, the region 1310 may be formed from a photo-imageable material, such as a solder mask.

Figure 22B:
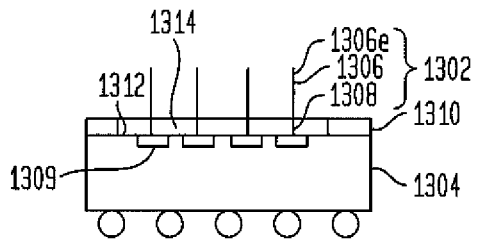

As shown in FIG. 22B, a stiffening layer 1314, which in one case may be referred to as wire locking material 1314, can be deposited onto the face 1312 of substrate 1304 and be contained fully or at least partly by the region 1310. In this way, the region 1310 may at least partly define the area in which the wire locking material is to be provided on surface 1312. The wire lengths can be as described above, and in a particular example, each wire 1304 may have a length within an approximate range of 150 to 200 micrometers. In one example, the wire locking material 1314 may be dispersed and distributed using a spin-on process. The wire locking material 1314 when deposited may cover a portion of the wire 1306 extending a distance from the face 1312 of the substrate 1304, e.g., the locking material may cover approximately 50 micrometers or approximately a quarter to a third of the length of the wire. The wire locking material 1314 increases the stiffness or the rigidity of the wire 1306, inhibiting flexing or bending the wire. In one example, the wire locking material may be a silica filled liquid encapsulant, which typically is stiffer than an equivalent non-filled encapsulant, such as that sold under the trade name NoSWEEP™.

Figure 22C:
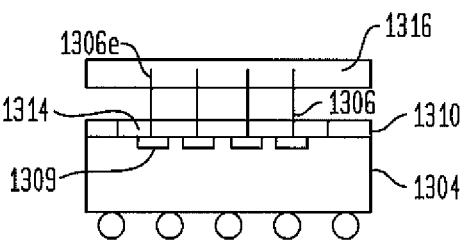

As shown in FIG. 22C, when forming an encapsulation, the wires 1306 may be inserted into a removable film 1316, which may be the same as or similar to the temporary film 1102 described above with respect to FIGS. 20A-20C, and may be formed from ethylene tetrafluroethylene. In an embodiment, the film 1316 may cover at least 10% of the length of the wire bonds and may be at least 50 micrometers. In one embodiment, the film 1316 may have a thickness that is 200 micrometers, although the film thickness can be greater than or less than 200 micrometers. The film 1316 prevents the end portions 1306e of the wires 1306 from being covered by a second material, e.g., a mold compound or other encapsulant 1318, such as during formation of the encapsulation layer 42 as described above.

Figure 22D:
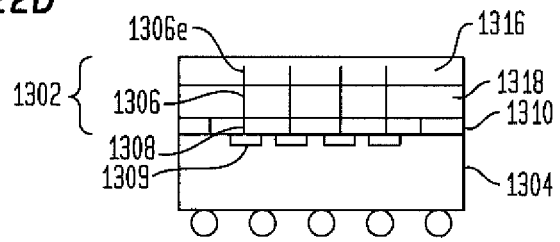
Figure 22E:
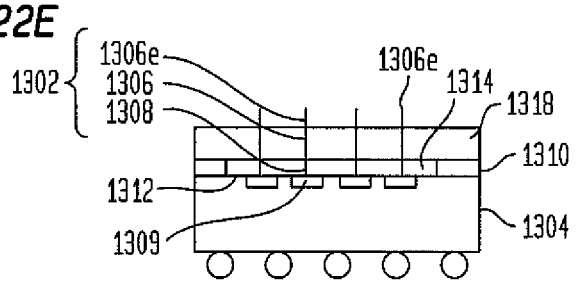

As described above with respect to FIGS. 20A and 20B, and as shown in FIG. 22D, the encapsulant 1318 may be deposited or flowed within an internal cavity of a mold in which the substrate and attached wire bonds have been placed, and a film 1316 has been provided similar to film 1102 shown in FIGS. 20A-20C. The reinforcement and stiffening of the wires 1306 by depositing the wire locking material 1314 around a portion of the wires, facilitates penetration of the wires 1306 into the film 1316 with less movement of the wires than would otherwise be achievable. After depositing the encapsulant 1318 to cover portions of the wires 1306, the film 1316 may be removed exposing the ends 1306e of the wires to form microelectronic assembly 1302 as seen in FIG. 22E.

Figure 39A:
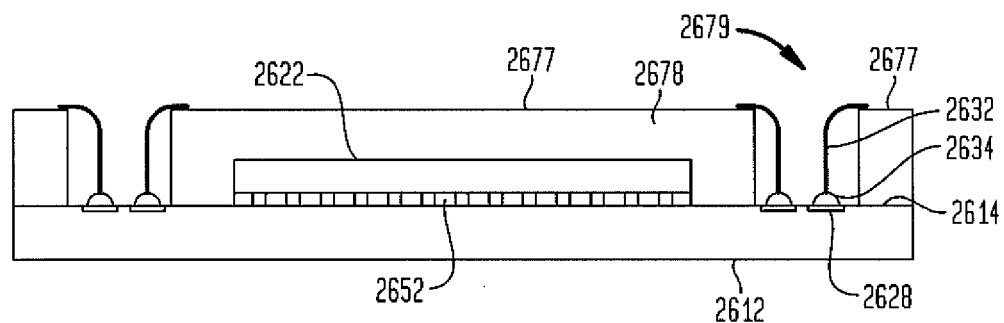
FIGS. 39A-C show sectional views illustrating stages of fabricating a microelectronic package according to another embodiment of the present disclosure.
Figure 39B:
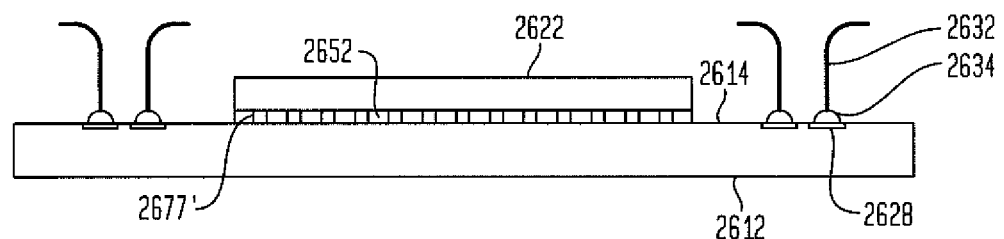
Figure 39C:
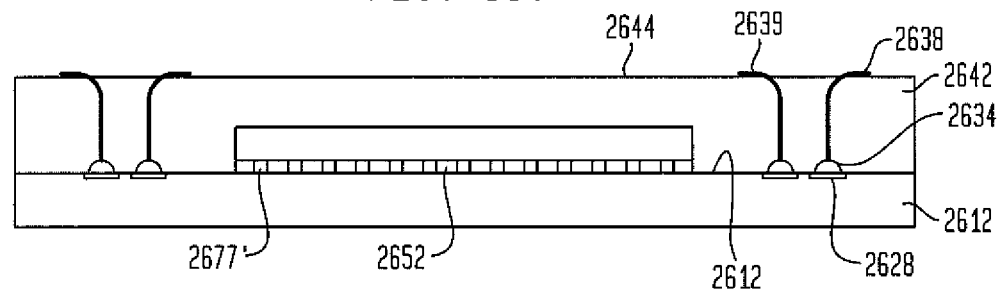

Another method for forming wire bonds 2632 to a predetermined height is shown in FIGS. 39A-C. In such a method a sacrificial encapsulation layer 2678 can be formed over the surface 2614 of substrate 2612, at least in the second 2620 region thereof. The sacrificial layer 2678 can also be formed over the first region 2618 of the substrate 2612 to cover the microelectronic element 2622 in a similar manner to the encapsulation layers described with respect to FIG. 1, above. The sacrificial layer 2678 includes at least one opening 2679 and in some embodiments a plurality of openings 2679 to expose the conductive elements 2628. The openings 2679 can be formed during molding of the sacrificial layer 2678 or after molding by etching, drilling, or the like. In one embodiment, a large opening 2679 can be formed to expose all of the conductive elements 2628, while in other embodiments a plurality of large openings 2679 can be formed to expose respective groups of conductive elements 2628. In further embodiments, openings 2629 can be formed that correspond to individual conductive elements 2628. The sacrificial layer 2678 is formed having a surface 2677 at a desired height for the wire bonds 2632 such that the wire bonds 2632 can be formed by bonding bases 2634 thereof to the conductive elements 2628 and then drawing out the wire to reach the surface 2677 of the sacrificial layer 2678. Then, the wire bonds can be drawn laterally of the opening to overlie portions of the surface 2677 of the sacrificial layer 2678. The capillary of the bond forming instrument (such as capillary 804 as shown in FIG. 14) can be moved to press the wire segment into contact with the surface 2677 such that the pressure on the wire between the surface 2677 and the capillary causes the wire to sever on surface 2677, as shown in FIG. 39A.

The sacrificial layer 2678 can then be removed by etching or another similar process. In an example, the sacrificial layer 2678 can be formed from a water soluble plastic material such that it can be removed by exposure to water without affecting the other components of the in-process unit 2610". In another embodiment, sacrificial layer 2678 can be made from a photoimageable material such as a photoresist such that it can be removed by exposure to a light source. A portion of sacrificial layer 2678' can remain between microelectronic element 2622 and surface 2614 of substrate 2612 that can act as an underfill surrounding solder balls 2652. After removal of the sacrificial layer 2678 an encapsulation layer 2642 is formed over the in-process unit to form package 2610. The encapsulation layer 2642 can be similar to those described above and can substantially cover surface 2614 of substrate 2612 and microelectronic element 2622. Encapsulation layer 2642 can further support and separate the wire bonds 2632. In the package 2610 shown in FIG. 29C, the wire bonds include portions of the edge surfaces 2637 thereof that are exposed at surface 2644 of the encapsulant 2642 and extend substantially parallel thereto. In other embodiments, the wire bonds 2632 and the encapsulation layer 2642 can be planarized to form a surface 2644 with wire bonds that have end surfaces exposed thereon and substantially flush therewith.

The above-described embodiments and variations of the invention can be combined in ways other than as specifically described above. It is intended to cover all such variations which lie within the scope and spirit of the invention.

The invention claimed is:

1. A microelectronic package comprising:
a component having a surface and a plurality of conductive elements at the surface;
a plurality of wire bonds having first ends joined to the conductive elements and second ends remote from the first ends, the wire bonds having lengths between their respective first and second ends;
a dielectric stiffening layer overlying the conductive elements and the surface, and covering a first portion of the length of each of the wire bonds; and
an encapsulation layer overlying the dielectric stiffening layer, in which the dielectric stiffening layer is stiffer and other than the encapsulation layer, above the surface of the component and covering a second portion of the length of each of the wire bonds, wherein second ends of the wire bonds are at least partially uncovered by the encapsulation layer at a surface of the encapsulation layer above the dielectric stiffening layer and remote from the dielectric stiffening layer.

2. The microelectronic package of claim 1, wherein the component is a substrate.

3. The microelectronic package of claim 1, further comprising a raised material region other than the encapsulation layer and the dielectric stiffening layer, the raised material region at least partially bordering (i) the dielectric stiffening layer in a direction extending from the surface of the component and at least one direction parallel to the surface of the component and (i) an area of the surface of the component at which the first ends of the wire bonds are joined respectively with the conductive elements.

4. The microelectronic package of claim 1, wherein the dielectric stiffening layer covers at least 10% of the length of the wire bonds.

5. The component of claim 1, wherein the dielectric stiffening layer covers at least 50 micrometers of the length of the wire bonds.

6. The component of claim 1, wherein each of the wire bonds is stitch bonded to one of the conductive elements.

7. The component of claim 1, wherein the wire bonds have bonding tool marks thereon adjacent the second ends of the wire bonds.

8. The component of claim 7, wherein the wire bonds are tapered in at least one direction adjacent the second ends of the wire bonds.

9. The component of claim 7, wherein the bonding tool mark is a ball-shaped region.

10. The component of claim 1, wherein the second ends of the wire bonds project away from the encapsulation layer at an angle of 65 to 90 degrees with respect to a plane defined by the surface of the encapsulation layer.

* * * * *